United States Patent
Lee et al.

(10) Patent No.: US 10,461,033 B2
(45) Date of Patent: Oct. 29, 2019

(54) SEMICONDUCTOR MEMORY PACKAGE

(71) Applicant: SAMSUNG ELECTRONICS CO., LTD., Suwon-si (KR)

(72) Inventors: Jong-Joo Lee, Hwaseong-si (KR); Hee-woo An, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/044,719

(22) Filed: Jul. 25, 2018

(65) Prior Publication Data
US 2019/0206797 A1    Jul. 4, 2019

(30) Foreign Application Priority Data
Jan. 2, 2018    (KR) ........................ 10-2018-0000269

(51) Int. Cl.
| | |
|---|---|
| *H01L 23/52* | (2006.01) |
| *H01L 23/538* | (2006.01) |
| *H01L 23/00* | (2006.01) |
| *H01L 25/065* | (2006.01) |

(52) U.S. Cl.
CPC .......... *H01L 23/5384* (2013.01); *H01L 24/17* (2013.01); *H01L 24/49* (2013.01); *H01L 25/0657* (2013.01)

(58) Field of Classification Search
CPC ..... H01L 23/5384; H01L 24/17; H01L 24/49; H01L 25/0657
USPC ....................................................... 257/774
See application file for complete search history.

(56) References Cited

U.S. PATENT DOCUMENTS

| | | | |
|---|---|---|---|
| 6,344,765 B2 | 2/2002 | Taguchi | |
| 7,030,712 B2 * | 4/2006 | Brunette | ............ H05K 1/0222 |
| | | | 333/238 |
| 7,282,791 B2 | 10/2007 | Funaba et al. | |
| 8,009,104 B2 | 8/2011 | Hossain | |
| 8,044,302 B2 | 10/2011 | Lee | |
| 8,586,873 B2 | 11/2013 | Wu | |
| 8,681,546 B2 | 3/2014 | Fai et al. | |
| 9,123,555 B2 | 9/2015 | Crisp et al. | |

(Continued)

FOREIGN PATENT DOCUMENTS

| | | | |
|---|---|---|---|
| JP | 4805757 B2 | 11/2011 | |
| JP | 5235750 B2 | 7/2013 | |

(Continued)

*Primary Examiner* — Luan C Thai
(74) *Attorney, Agent, or Firm* — Sughrue Mion, PLLC

(57) ABSTRACT

A semiconductor memory package is provided. The package includes a base substrate, and chip connection pads and external connection pads respectively arranged on upper and lower surfaces of the base substrate; and two semiconductor memory chips mounted on the base substrate each having chip pads electrically connected to the chip connection pads. A first electrical path extends from an external connection pad to a first chip pad of one of the chips and a second electrical path extends from the external connection pad to a second chip pad of another chip, the first and second electrical paths have a common line, and the first electrical path has a first branch line and the second electrical path has a second branch line. The base substrate includes an open stub extending from the common line and having an end which is open without being connected to another electrical path.

20 Claims, 19 Drawing Sheets

(56) References Cited

U.S. PATENT DOCUMENTS

| | | |
|---|---|---|
| 9,160,046 B2 | 10/2015 | Ao et al. |
| 9,236,111 B2 * | 1/2016 | Cho |
| 9,264,010 B2 * | 2/2016 | Lee .................. H03H 7/17 |
| 9,276,549 B1 | 3/2016 | Cheng et al. |
| 9,721,644 B2 | 8/2017 | Kim et al. |
| 2004/0207496 A1 | 10/2004 | Lee et al. |
| 2012/0055016 A1 | 3/2012 | Gorcea |
| 2014/0016686 A1 | 1/2014 | Ben Artsi |
| 2014/0264904 A1 | 9/2014 | Fai et al. |
| 2015/0018294 A1 | 1/2015 | DeBenedetti et al. |
| 2015/0371698 A1 | 12/2015 | Mizuno |

FOREIGN PATENT DOCUMENTS

| | | |
|---|---|---|
| KR | 10-0814375 B1 | 3/2008 |
| KR | 10-2015-0061368 A | 6/2015 |

* cited by examiner

FIG. 16
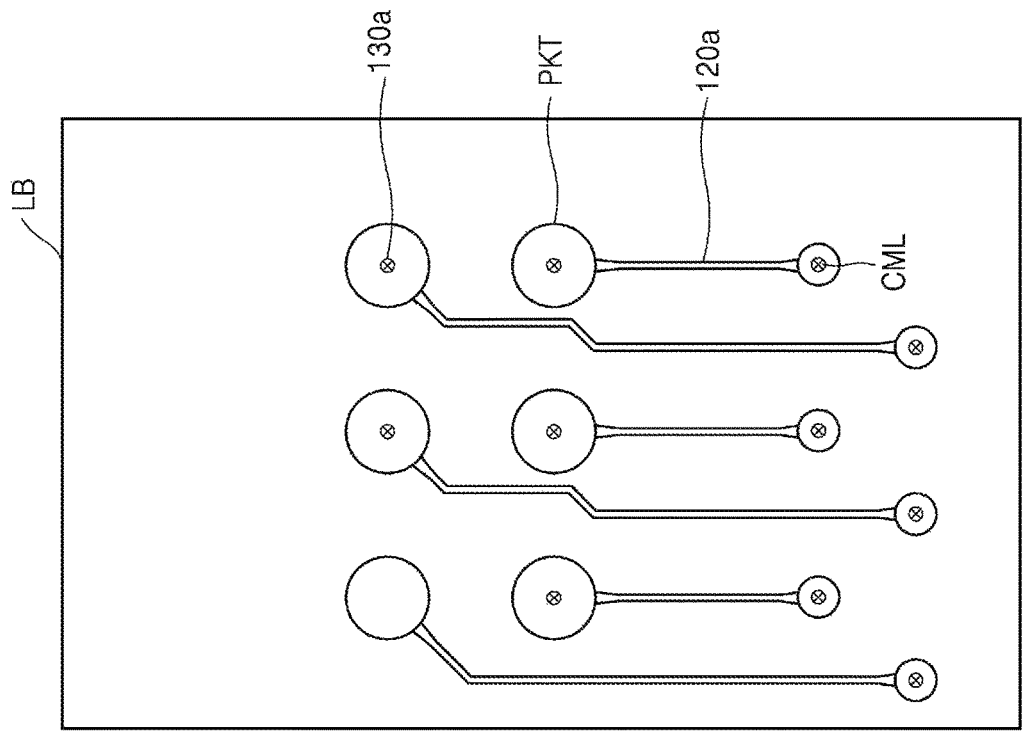
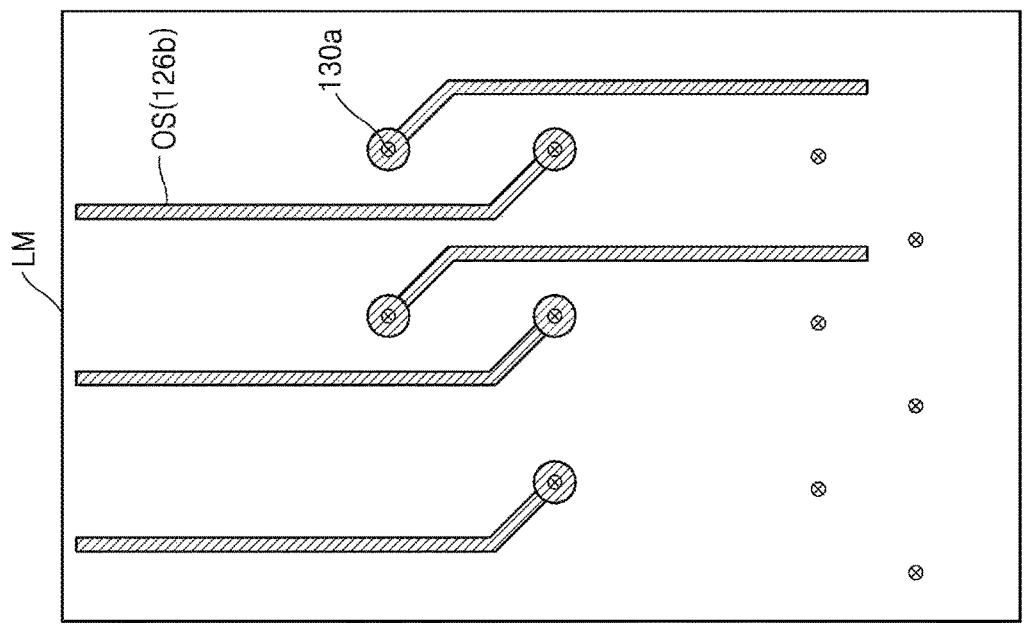

SEMICONDUCTOR MEMORY PACKAGE

CROSS-REFERENCE TO RELATED APPLICATION

This application claims priority from Korean Patent Application No. 10-2018-0000269, filed on Jan. 2, 2018, in the Korean Intellectual Property Office, the disclosure of which is incorporated by reference herein in its entirety.

BACKGROUND

The inventive concept relates to a semiconductor memory package, and more particularly, to a semiconductor memory package in which a plurality of semiconductor memory chips are connected to a memory interface of one channel.

Electronic devices have been required to be more compact and have higher capacity in accordance with rapid development in the electronics industry and with user demand. However, the high capacity of semiconductor memory chips has not been able to meet such demands. Accordingly, a plurality of semiconductor memory chips connected to one channel memory interface are included in one semiconductor memory package, thereby meeting the demand for high capacity.

SUMMARY

The inventive concept provides a semiconductor memory package having a high-speed operation characteristic and having a plurality of semiconductor memory chips.

According to an aspect of an example embodiment, there is provided a semiconductor memory package including a package base substrate comprising a substrate base, and a plurality of chip connection pads and a plurality of external connection pads respectively arranged on upper and lower surfaces of the substrate base; and at least two semiconductor memory chips mounted on the package base substrate and each having a plurality of chip pads electrically connected to the plurality of chip connection pads, wherein a first electrical path extends from one of the plurality of external connection pads to a first chip pad of one of the at least two semiconductor memory chips and a second electrical path extends from the one of the plurality of external connection pads to a second chip pad of another of the at least two semiconductor memory chips, the first electrical path and the second electrical path comprises a common line extending from a branch point of the first electrical path and the second electrical path, to the one of the plurality of external connection pads, a first branch line of the first electrical path extends from the branch point to the first chip pad and a second branch line of the second electrical path extends from the branch point to the second chip pad, and the package base substrate comprises an open stub extending from the common line, the open stub having one end connected to the common line and another other end which is open without being connected to another electrical path and having a stub extension length greater than half of a branch extension length of a longer of the first branch line and the second branch line and less than twice the branch extension length.

According to another aspect of an example embodiment, there is provided a semiconductor memory package including a package base substrate comprising a substrate base, a plurality of chip connection pads arranged on an upper surface of the substrate base and a plurality of external connection pads arranged on a lower surface of the substrate base and electrically connected to the plurality of chip connection pads, and an open stub comprising one end electrically connected to one of the plurality of external connection pads and an other end extending from the one end and being open without being connected to another electrical path; at least two semiconductor memory chips mounted on the package base substrate, each having a chip connection terminal pad, a chip pad, and a rewiring pattern connecting the chip connection terminal pad to the chip pad and each having at least one bonding wire connecting the chip connection terminal pad to one or more of the plurality of chip connection pads.

According to another aspect of an example embodiment, there is provided a semiconductor memory package including a package base substrate comprising a substrate base comprising a plurality of layers, a plurality of chip connection pads arranged on an upper surface of the substrate base and a plurality of external connection pads arranged on a lower surface of the substrate base and electrically connected to the plurality of chip connection pads, a ground plane layer formed between the plurality of layers included in the substrate base, and an open stub electrically connected to one of the plurality of external connection pads and extending between the plurality of layers and away from the ground plane layer; a first semiconductor memory chip attached on the package base substrate and a second semiconductor memory chip stacked on the first semiconductor memory chip, the first semiconductor memory chip having a first chip connection terminal pad, a first chip pad, and a first rewiring pattern connecting the first chip connection terminal pad to the first chip pad, and the second semiconductor memory chip having a second chip connection terminal pad, a second chip pad, and a second rewiring pattern connecting the second chip connection terminal pad to the second chip pad; and a first bonding wire connecting the first chip connection terminal pad to one or more of the plurality of chip connection pads, and a second bonding wire connecting the second chip connection terminal pad to one or more of the plurality of chip connection pads.

According to another aspect of an example embodiment, there is provided a semiconductor memory package comprising a base substrate comprising a chip connection pad arranged on an upper surface thereof, and an external connection pad arranged on a lower surface thereof, a common line electrically connecting the chip connection pad to the external connection pad through the base substrate; a first semiconductor memory chip provided on the upper surface of the base substrate and comprising a first chip pad electrically connected to an internal circuit of the first semiconductor chip, the first chip pad being electrically connected to the external connection pad by a first electrical path comprising the common line and a first branch line; a second semiconductor memory chip provided on the upper surface of the package base and comprising a second chip pad electrically connected to an internal circuit of the second semiconductor chip, the second chip pad being electrically connected to the external connection pad by a second electrical path comprising the common line and a second branch line; and an open stub having one end connected to the common line and the other end being open without being connected to another electrical path.

BRIEF DESCRIPTION OF THE DRAWINGS

Example embodiments of the inventive concept will be more clearly understood from the following detailed description taken in conjunction with the accompanying drawings in which:

FIGS. 14 to 18 are layouts of a wiring pattern of a package base substrate of a semiconductor memory package according to an example embodiment.

DETAILED DESCRIPTION

Figure 1:
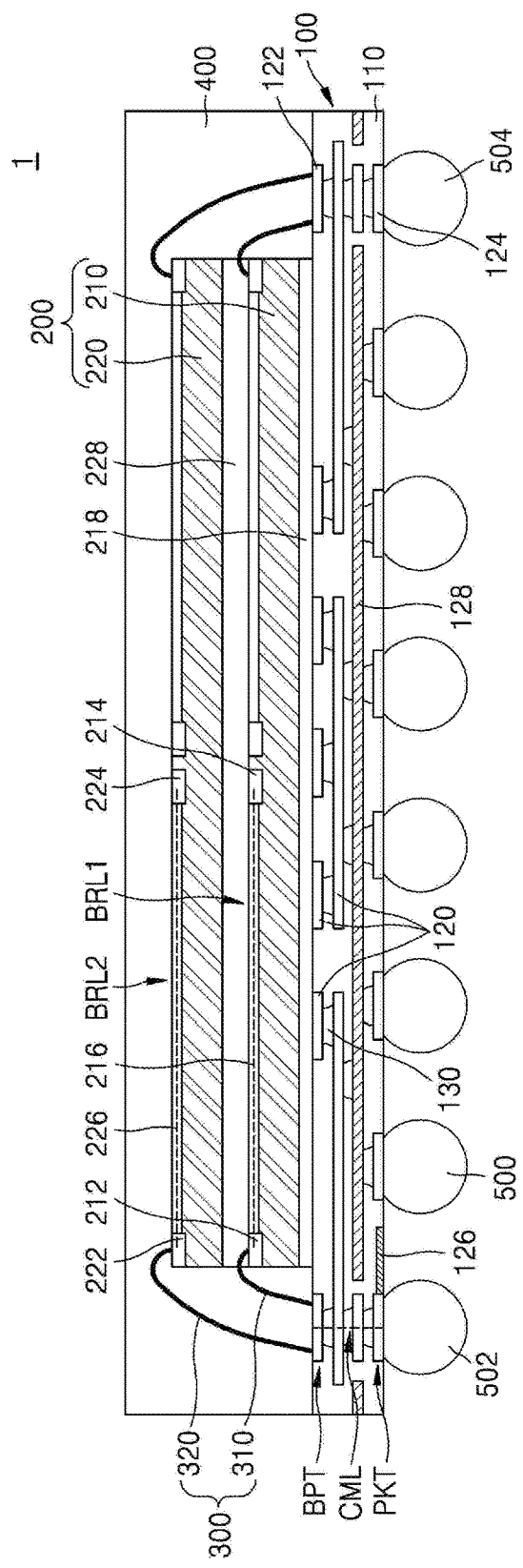
FIG. 1 is a cross-sectional view of a semiconductor memory package according to an example embodiment.

FIG. 1 is a cross-sectional view of a semiconductor memory package 1 according to an example embodiment.

Referring to FIG. 1, the semiconductor memory package 1 includes a package base substrate 100 and at least two semiconductor memory chips 200.

In some example embodiments, the package base substrate 100 may be a printed circuit board (PCB). For example, the package base substrate 100 may be a double-sided PCB or a multi-layer PCB. The package base substrate 100 may include a substrate base 110 including at least one material selected from phenol resin, epoxy resin, and polyimide. The substrate base 110 may include at least one material selected from phenol resin, epoxy resin, and polyimide. The substrate base 110 may include at least one material selected from, for example, frame retardant 4 (FR4), tetrafunctional epoxy, polyphenylene ether, epoxy/polyphenylene oxide, bismaleimide triazine (BT), thermount, cyanate ester, polyimide, and liquid crystal polymer.

The package base substrate 100 may have wiring patterns 120 formed in upper and lower surfaces of the substrate base 110. In some example embodiments, if the package base substrate 100 is a multi-layer substrate in which the substrate base 110 includes a plurality of layers, a wiring pattern 120 may be formed between each of the plurality of layers of the substrate base 110. The package base substrate 100 may include a conductive via 130 connected with the wiring pattern 120 in the substrate base 110. The conductive via 130 may penetrate all or a portion of the substrate base 110 to electrically connect with the wiring patterns 120. The wiring pattern 120 and/or the conductive via 130 may include copper, nickel, stainless steel, or beryllium copper.

Solder resist layers (not shown) may be formed in upper and lower surfaces of the package base substrate 100 to cover at least a portion of the wiring patterns 120 arranged on the upper and lower surfaces of the substrate base 110. A portion of the wiring patterns 120 arranged on the upper and lower surfaces of the substrate base 110 that is not covered with the solder resist layers may be a plurality of chip connection pads 122 to be electrically connected to the at least two semiconductor memory chips 200 and a plurality of external connection pads 124 electrically connected to a plurality of external connection terminals 500.

When an external connection terminal 500 is a solder ball, an external connection pad 124 may be referred to as a ball-land pattern. When the external connection terminal 500 is a pin, the external connection pad 124 may be referred to as a pin-land pattern.

A portion of the wiring pattern 120 may be an open stub 126 extending from a portion that connects a chip connection pad 122 and an external connection pad 124 that corresponds to the chip connection pad 122. In other words, the open stub 126 may extend from the chip connection pad 122, the external connection pad 124, and/or a portion between the chip connection pad 122 and the corresponding external connection pad 124. The open stub 126 will be described in detail with reference to FIG. 12.

In some example embodiments, if the package base substrate 100 is a multi-layer substrate in which the substrate base 110 includes a plurality of layers, some of the wiring patterns 120 formed between the plurality of layers of the substrate base 110 may include a ground plane layer 128 to which a ground signal is provided. The ground plane layer 128 may be located at a level closer to the lower surface than to an upper surface of the substrate base 110.

The at least two semiconductor memory chips 200 may be mounted on the package base substrate 100. In some example embodiments, the at least two semiconductor memory chips 200 may be stacked vertically on the package base substrate 100, but example embodiments are not limited thereto. The at least two semiconductor memory chips 200 may include a plurality of chip connection terminal pads 212 and 222, a plurality of chip pads 214 and 224, and a plurality of rewiring patterns 216 and 226.

The at least two semiconductor memory chips 200 may include a first semiconductor memory chip 210 and a second semiconductor memory chip 220. In some example embodiments, the first semiconductor memory chip 210 may be mounted on the upper surface of the package base substrate 100 with a first die adhesive film 218 therebetween, and the second semiconductor memory chip 220 may be mounted on the first semiconductor memory chip 210 with a second die adhesive film 228 therebetween.

The first semiconductor memory chip 210 and the second semiconductor memory chip 220 may be the same kind of semiconductor memory chip having the same capacity. The description of the first semiconductor memory chip 210 may also be applied to the second semiconductor memory chip 220 unless otherwise specified.

Each of the first semiconductor memory chip 210 and the second semiconductor memory chip 220 may include a semiconductor substrate. The semiconductor substrate may include, for example, silicon (Si). Alternatively, the semiconductor substrate may include a semiconductor element such as germanium (Ge), or a compound semiconductor such as silicon carbide (SiC), gallium arsenide (GaAs), indium arsenide (InAs), and indium phosphide (InP). The semiconductor substrate may have an active surface and an inactive surface opposite the active surface. The first semiconductor memory chip 210 and the second semiconductor memory chip 220 may be formed with a semiconductor device including a plurality of individual devices of various types on the active surface.

The first semiconductor memory chip 210 and the second semiconductor memory chip 220 may be, for example, a volatile memory semiconductor chip such as dynamic random access memory (DRAM) or static random access memory (static RAM), or a nonvolatile memory semiconductor chip such as phase-change RAM (PRAM), magnetoresistive RAM (MRAM), ferroelectric RAM (FeRAM), or resistive RAM (RRAM).

The first semiconductor memory chip 210 may include, on the active surface, the plurality of first chip connection terminal pads 212, the plurality of first chip pads 214, and a first rewiring pattern 216 connecting each of the first chip connection terminal pads 212 to each of the first chip pads 214. Similarly, the second semiconductor memory chip 220 may include, on the active surface, the plurality of second chip connection terminal pads 222, the plurality of second chip pads 224, and a second rewiring pattern 226 connecting each of the second chip connection terminal pads 222 to each of the second chip pads 224. The number of the plurality of first chip connection terminal pads 212 and the number of the plurality of first chip pads 214 may be the same, and the number of the plurality of second chip connection terminal pads 222 and the number of the plurality of second chip pads 224 may be the same.

Each of the plurality of first chip pads 214 and the plurality of second chip pads 224 may be arranged in a center pad manner at a central portion of the active surface of each of the first semiconductor memory chip 210 and the second semiconductor memory chip 220. Each of the plurality of first chip pads 214 and the plurality of second chip pads 224 may be electrically connected to the semiconductor devices of the first semiconductor memory chip 210 and the second semiconductor memory chip 220.

Each of the first rewiring pattern 216 and the second rewiring pattern 226 may extend on the active surface of each of the first semiconductor memory chip 210 and the second semiconductor memory chip 220.

Each of the plurality of first chip connection terminal pads 212 may be electrically connected to the semiconductor device of the first semiconductor memory chip 210 through the first rewiring pattern 216 and a first chip pad 214, and each of the plurality of second chip connection terminal pads 222 may be electrically connected to the semiconductor device of the second semiconductor memory chip 220 through the second rewiring pattern 226 and a second chip pad 224.

In some example embodiments, each of the plurality of first chip pads 214 and the plurality of second chip pads 224 may be arranged in an edge pad manner at an edge portion of the active surface of each of the first semiconductor memory chip 210 and the second semiconductor memory chip 220. Here, the first semiconductor memory chip 210 and the second semiconductor memory chip 220 may omit a first chip connection terminal pad 212 and the first rewiring pattern 216, and a second chip connection terminal pad 222 and the second rewiring pattern 226, respectively. Each of the plurality of first chip pads 214 and the plurality of second chip pads 224 may perform functions of the first chip connection terminal pad 212 and the second chip connection terminal pad 222 together.

In some example embodiments, even when each of the plurality of first chip pads 214 and the plurality of second chip pads 224 are arranged in an edge pad manner at an edge portion of the active surface of each of the first semiconductor memory chip 210 and the second semiconductor memory chip 220, the first semiconductor memory chip 210 and the second semiconductor memory chip 220 may have the first chip connection terminal pad 212 and the first rewiring pattern 216, and the second chip connection terminal pad 222 and the second rewiring pattern 226, respectively.

The at least two semiconductor memory chips 200 may be electrically connected to the package base substrate 100 through a plurality of bonding wires 300. In more detail, the at least two semiconductor memory chips 200 and the package base substrate 100 may be electrically connected to each other through the plurality of bonding wires 300 respectively connecting the plurality of chip connection terminal pads 212 and 222 to the plurality of chip connection pads 122. The plurality of bonding wires 300 may include a first bonding wire 310 connecting the chip connection pad 122 to the first chip connection terminal pad 212 of the first semiconductor memory chip 210, and a second bonding wire 320 connecting the chip connection pad 122 to a first chip connection terminal pad 214 of the second semiconductor memory chip 210.

The at least two semiconductor memory chips 200 and a mold member 400 covering a bonding wire 300 may be arranged on the package base substrate 100. The mold member 400 may include, for example, an epoxy molding compound (EMC).

The plurality of external connection terminals 500 may be respectively attached to the plurality of external connection pads 124 of the package base substrate 100. The plurality of external connection terminals 500 may include a first external connection terminal 502 for transmitting or receiving a relatively high-speed signal, and a second external connection terminal 504 for transmitting or receiving a relatively low-speed signal.

For example, from among the plurality of external connection terminals 500, the first external connection terminal 502 may be for data input/output (DQ) or clock signal (CK), and the second external connection terminal 504 may be a remaining portion of signals other than the first external connection terminal 502. For example, the second external connection terminal 504 may be for command input (CMD), address input (A), chip select (CS), supply DQ power supply (VDDQ), supply DQ ground (VSSQ), supply reference pin for ZQ calibration (ZQ), and the like. In some example embodiments, some of the plurality of external connection terminals 500 may be for a no connect (NC) without an internal electrical connection.

Although FIG. 1 shows that the first external connection terminal 502 is on the left side and the second external connection terminal 504 is on the right side, this is only for convenience of illustration. Positions and the number of the first external connection terminal 502 and the second external connection terminal 504 are not limited thereto.

Each of the first external connection terminal 502 and the second external connection terminal 504 may be electrically connected to the chip connection pad 122 through the external connection pad 124, the wiring pattern 120 in the substrate base 110, and/or the conductive via 130. The wiring pattern 120 and/or the conductive via 130 in the substrate base 110 for electrically connecting the chip connection pad 122 to the external connection pad 124 that correspond to each other may be referred to as an internal conductive line.

The first bonding wire 310 and the second bonding wire 320 may be connected to one of the chip connection pads 122 in common. The first bonding wire 310 and the second bonding wire 320 may be connected to the first chip connection terminal pad 212 of the first semiconductor memory chip 210 and the second chip connection terminal pad 222 of the second semiconductor memory chip 220, respectively.

The external connection pad 124 to which the first external connection terminal 502 is attached may be referred to as a package terminal PKT. An electrical path between the external connection pad 124 formed of the wiring pattern 120 in the substrate base 110 and/or the conductive via 130 and the chip connection pad 122 may be referred to as a common line CML (shown using a dashed line in FIGS. 1-4), wherein the chip connecting pad 122 may be referred to as a branch point BPT. An electrical path from the chip connection pad 122 to the first chip pad 214 that includes the chip connection pad 122, the first bonding wire 310, the first chip connection terminal pad 212, and the first rewiring pattern 216 and the first chip pad 214 may be referred to as a first branch line BRL1. An electrical path from the chip connection pad 122 to the second chip pad 224, including the chip connection pad 122, the second bonding wire 320, the second chip connection terminal pad 222, the second rewiring pattern 226 and the second chip pad 224 may be referred to as a second branch line BRL2. A length of the electrical path constituted by the second branch line BRL2 may have a value greater than a length of the electrical path constituted by the first branch line BRL1. Hereinafter, the lengths of electrical paths constituted by the first and second branch lines BRL1 and BRL2 may be referred to as extension lengths of the first and second branch lines BRL1 and BRL2, respectively.

Electrical paths from the external connection pad 124 to which the second external connection terminal 504 is attached to the first and second chip pads 214 and 224 may also be referred to as the package terminal PKT, the common line CML, the branch point BPT, and the first and second branch lines BRL1 and BRL2 like the electrical paths from the external connection pad 124 to which the first external connection terminal 502 is attached to the first and second chip pads 214 and 224.

Therefore, the semiconductor memory package 1 may be connected from the first and second external connection terminals 502 and 504 to the first and second chip pads 214 and 224 of the first and second semiconductor memory chips 210 and 220, and from the package terminal PKT to the branch point BPT with the common line CML, which is an electrical path. The branch point BPT and the first and second chip pads 214 and 224 may be respectively connected to each other by the first and second branch lines BRL1 and BRL2 that are separate electrical paths branched from each other.

In some example embodiments, the open stub 126 may be connected to a portion closer to the package terminal PKT than the branch point BPT of the common line CML connected to the first external connection terminal 502. For example, the open stub 126 may be connected to the external connection pad 124 to which the first external connection terminal 502 is attached, that is, a portion of the common line CML that contacts the package terminal PKT. The open stub 126 may be a portion of the wiring pattern 120 on a lower surface of the substrate base 110. One end of the open stub 126 may be connected to the external connection pad 124 to which the first external connection terminal 502 is attached, and the other end of the open stub 126 may be open without being connected to another electrical path.

A length extending from the one end to the other end of the open stub 126 may be greater than half of the extension length of the second branch line BRL2 having a value greater than that of the extension length of the first branch line BRL1 and less than twice the extension length of the second branch line BRL2. In some example embodiments, the extension length of the open stub 126 may have a value that is substantially the same as that of the extension length of the second branch line BRL2.

In some example embodiments, the open stub 126 may not be connected to the common line CML connected to the second external connection terminal 504. That is, the open stub 126 may be connected to the common line CML connected to the first external connection terminal 502 for transmitting or receiving a relatively high-speed signal from among the plurality of external connection terminals 500, and may not be connected to the common line CML connected to the second external connection terminal 504 for transmitting or receiving a relatively low-speed signal.

In a semiconductor memory package according to the related art including a plurality of semiconductor memory chips connected without an open stub to a memory interface of one channel through a plurality of branch lines constituting multiple branches, when a semiconductor memory chip connected to a branch line having a relatively short extension length receives a signal, signal distortion may occur due to a signal reflected by the end of a branch line having a relatively long extension length.

However, the semiconductor memory package 1 according to the example embodiment includes the open stub 126 connected to the common line CML constituting the memory interface of one channel. Therefore, when the first semiconductor memory chip 210 connected to the first branch line BRL1 having a relatively short extension length receives a signal, a signal reflected by the one end of the open stub 126 may compensate for signal distortion due to a signal reflected by an end of the second branch line BRL2. Therefore, signal characteristics of a semiconductor memory package that operates at a high speed may be improved. This will be described in detail with reference to FIGS. 12 and 13.

Figure 2:
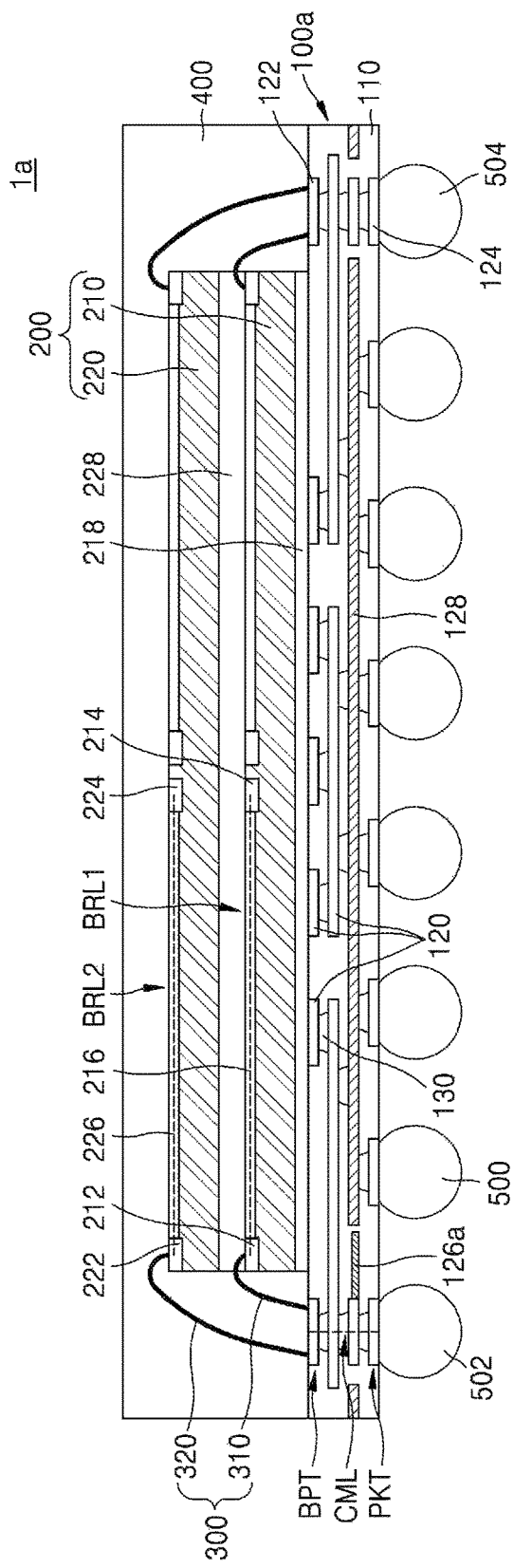
FIG. 2 is a cross-sectional view of a semiconductor memory package according to an example embodiment.

FIG. 2 is a cross-sectional view of a semiconductor memory package 1a according to an example embodiment. In FIG. 2, the same reference numerals as in FIG. 1 denote the same elements, and therefore, detailed descriptions thereof will not be given herein.

Referring to FIG. 2, the semiconductor memory package 1a includes a package base substrate 100a and the at least two semiconductor memory chips 200.

An open stub 126a may be connected to a portion closer to the package terminal PKT than to the branch point BPT of the common line CML connected to the first external connection terminal 502. For example, the open stub 126a may be between a plurality of layers formed by the substrate base 110. In more detail, the open stub 126a may be a portion of the wiring pattern 120 between the plurality of layers formed by the substrate base 110. One end of the open stub 126a may be connected to a portion closer to the package terminal PKT than to the branch point BPT of a central portion of the common line CML connected to the first external connection terminal 502, and the other end of the open stub 126a may be open without being connected to other electrical paths.

That is, when the package base substrate 100 is a multi-layer board, the open stub 126a may be arranged on a layer different from a layer where the plurality of chip connection pads 122 and from a layer where the plurality of external connection pads 124 are arranged.

A length extending from the one end to the other end of the open stub 126a may be greater than half of the extension length of the second branch line BRL2 having a value greater than that of the extension length of the first branch line BRL1 and less than twice the extension length of the second branch line BRL2. In some example embodiments, the extension length of the open stub 126a may have a value that is substantially the same as that of the extension length of the second branch line BRL2.

Figure 3:
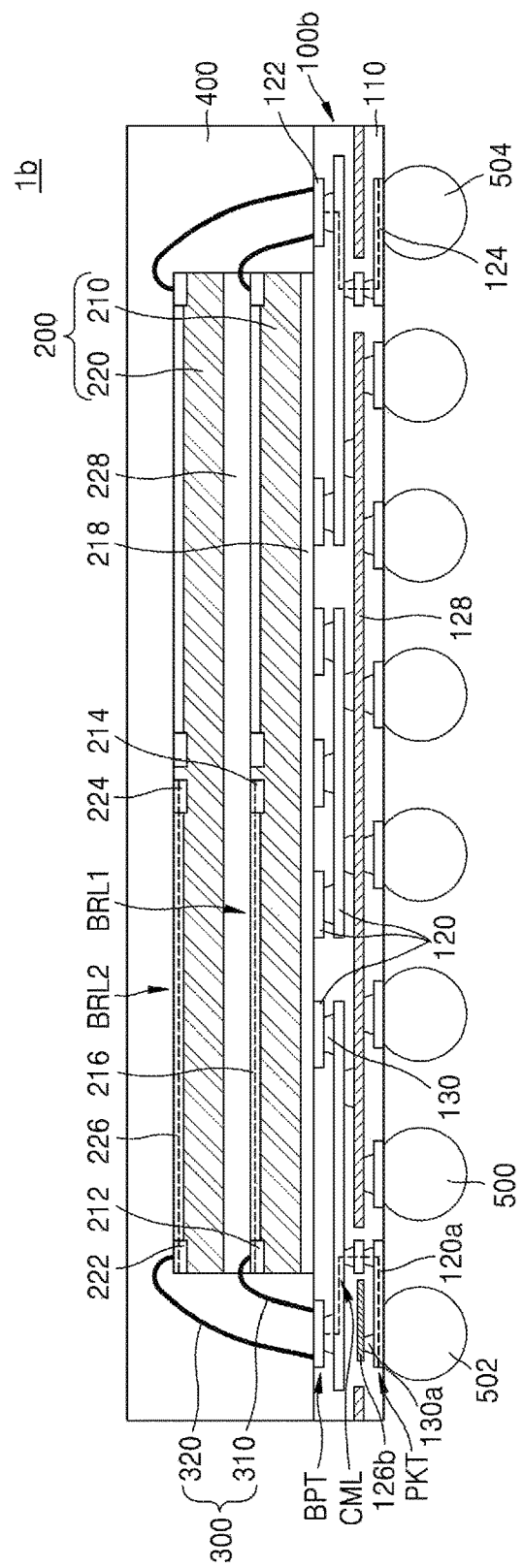
FIG. 3 is a cross-sectional view of a semiconductor memory package according to an example embodiment.

FIG. 3 is a cross-sectional view of a semiconductor memory package 1b according to an example embodiment. In FIG. 3, the same reference numerals as in FIG. 1 denote the same elements, and therefore, detailed descriptions thereof will not be given herein.

Referring to FIG. 3, the semiconductor memory package 1b includes a package base substrate 100b and the at least two semiconductor memory chips 200.

The common line CML may include a portion of the wiring pattern 120 extending along the lower surface of the substrate base 110. That is, the common line CML may have a portion extending from the external connection pad 124 along the lower surface of the substrate base 110.

An open stub 126b may be connected to a portion closer to the package terminal PKT than the branch point BPT of the common line CML connected to the first external connection terminal 502. For example, the open stub 126b may be between a plurality of layers formed by the substrate base 110. In more detail, the open stub 126b may be a portion of the wiring pattern 120 between the plurality of layers formed by the substrate base 110. An auxiliary conductive via 130a penetrating a portion of the substrate base 110 may be arranged on the external connection pad 124 to which the first external connection terminal 502 is attached. The open stub 126b may be electrically connected to the external connection pad 124 through the auxiliary conductive via 130a. A height of the auxiliary conductive via 130a may have a relatively small value compared to a value of an extension length of the open stub 126b. Therefore, the open stub 126b may function substantially as if the open stub 126b were connected to the external connection pad 124 to which the first external connection terminal 502 is attached.

A length extending from the one end to the other end of the open stub 126b may be greater than half of the extension length of the second branch line BRL2 having a value greater than that of the extension length of the first branch line BRL1 and less than twice the extension length of the second branch line BRL2. In some example embodiments, the extension length of the open stub 126b may have a value that is substantially the same as that of the extension length of the second branch line BRL2.

Figure 4:
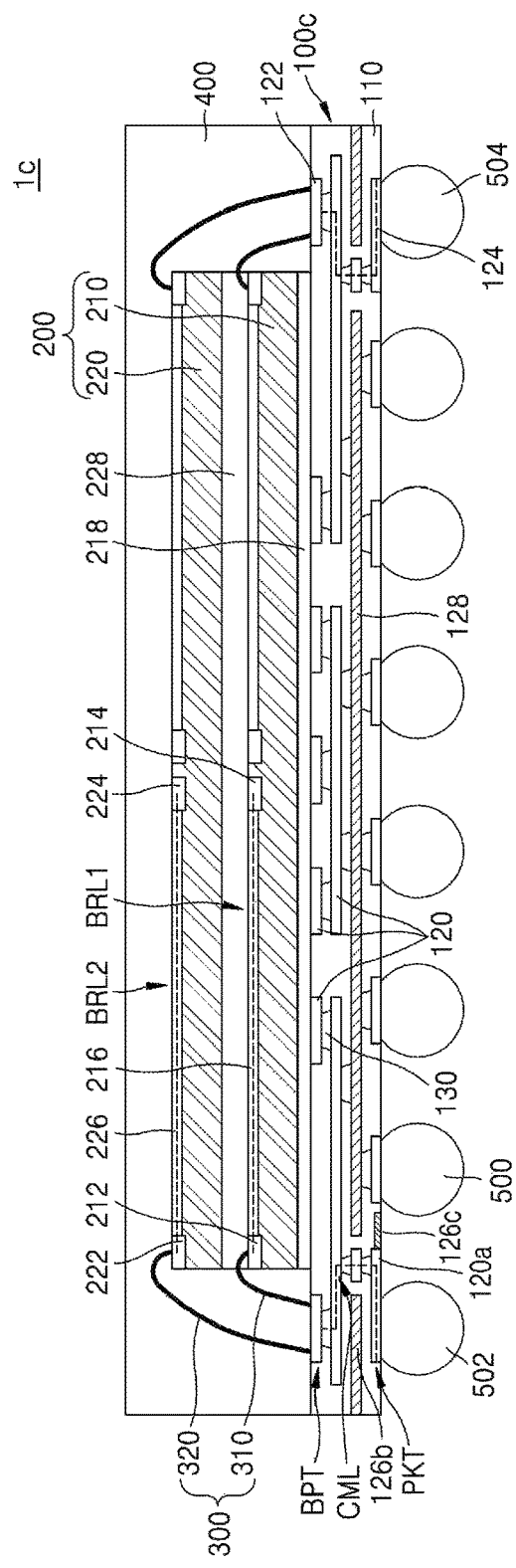
FIG. 4 is a cross-sectional view of a semiconductor memory package according to an example embodiment.

FIG. 4 is a cross-sectional view of a semiconductor memory package 1c according to an example embodiment. In FIG. 4, the same reference numerals as in FIGS. 1 and 3 denote the same elements, and therefore, detailed descriptions thereof will not be given herein.

Referring to FIG. 4, the semiconductor memory package 1c includes a package base substrate 100c and the at least two semiconductor memory chips 200.

The common line CML may include a portion 120a of the wiring pattern 120 extending along the lower surface of the substrate base 110. That is, the common line CML may have the portion 120a extending from the external connection pad 124 along the lower surface of the substrate base 110.

The open stub 126c may be connected to the portion 120a of the wiring pattern 120 extending from the external connection pad 124 along the lower surface of the substrate base 110 and forming a portion of the common line CML. The open stub 126c may extend along the lower surface of the substrate base 110. In more detail, the open stub 126c may be a portion of the wiring pattern 120 on the lower surface of the substrate base 110.

An extension length of the portion 120a of the wiring pattern 120 extending along the lower surface of the substrate base 110 from among the common lines CML may have a smaller value than the extension length of the remaining portion of the common line CML. That is, an extension length of a portion of the common line CML from the package terminal PKT to the position at which the open stub 126c is connected to the common line CML may have a smaller value that an extension length of a portion of the common line CML from the branch point BPT to the position at which the open stub 126c is connected to the common line CML. That is, the open stub 126c may be connected to a portion closer to the package terminal PKT than the branch point BPT of the common line CML connected to the first external connection terminal 502.

A length extending from the one end to the other end of the open stub 126c may be greater than half of the extension length of the second branch line BRL2 having a value greater than that of the extension length of the first branch line BRL1 and less than twice the extension length of the second branch line BRL2. In some embodiments, the extension length of the open stub 126c may have a value that is substantially the same as that of the extension length of the second branch line BRL2.

Figure 5:
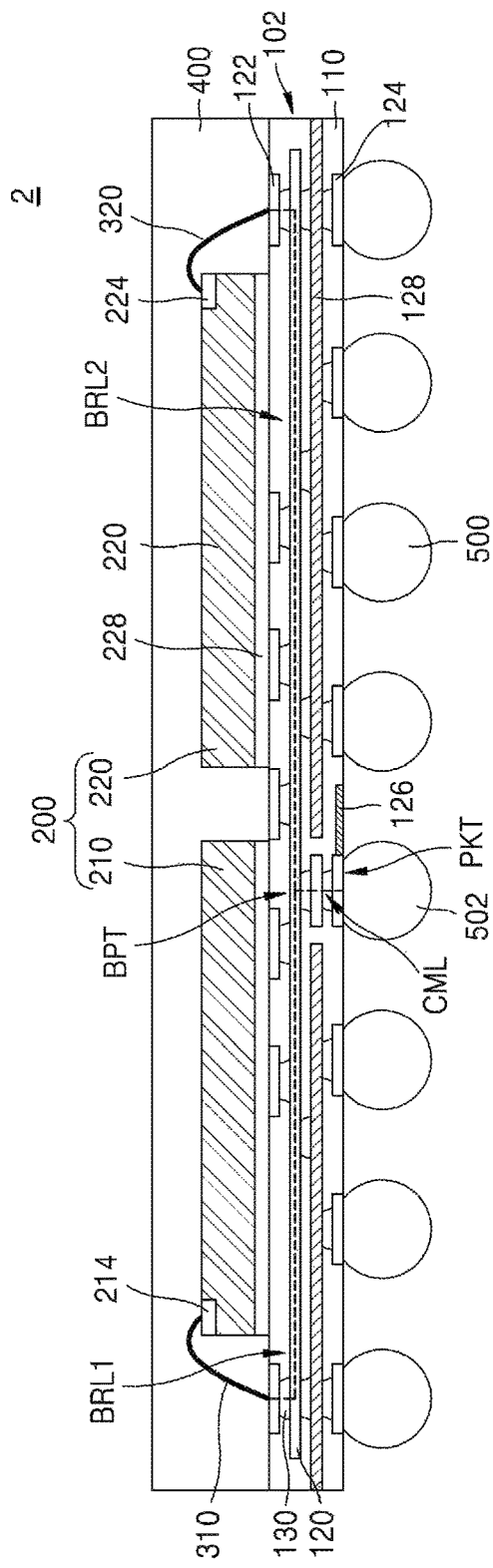
FIG. 5 is a cross-sectional view of a semiconductor memory package according to an example embodiment.

FIG. 5 is a cross-sectional view of a semiconductor memory package 2 according to an example embodiment. In FIG. 5, the same reference numerals as in FIG. 1 denote the same elements, and therefore, detailed descriptions thereof will not be given herein.

Referring to FIG. 5, the semiconductor memory package 2 includes a package base substrate 102 and the at least two semiconductor memory chips 200. In some example embodiments, the package base substrate 102 may be a PCB.

The at least two semiconductor memory chips 200 may be mounted on the package base substrate 102. In some example embodiments, the at least two semiconductor memory chips 200 may be spaced apart from and attached to each other in a horizontal direction on the package base substrate 102. The at least two semiconductor memory chips 200 may include the first semiconductor memory chip 210 and the second semiconductor memory chip 220. In some example embodiments, the first semiconductor memory chip 210 may be mounted on the upper surface of the package base substrate 102 with the first die adhesive film 218 therebetween, and the second semiconductor memory chip 220 may be spaced apart from the first semiconductor memory chip 210 and may be mounted on the package base substrate 102 with the second die adhesive film 228 therebetween.

FIG. 5 shows that each of the plurality of first chip pads 214 and the plurality of second chip pads 224 is arranged in an edge pad manner at an edge portion of the active surface of each of the first semiconductor memory chip 210 and the second semiconductor memory chip 220, but the inventive concept is not limited thereto. For example, each of the plurality of first chip pads 214 and the plurality of second chip pads 224 may be arranged in a center pad manner at a central portion of the active surface of each of the first semiconductor memory chip 210 and the second semiconductor memory chip 220. Although not shown, each of the first semiconductor memory chip 210 and the second semiconductor memory chip 220 may further include the first chip connection terminal pad 212, the first rewiring pattern 216, and the second chip connection terminal pad 222 and the second rewiring pattern 226 as shown in FIG. 1.

The first external connection terminal 502 may be electrically connected to the chip connection pad 122 through the external connection pad 124, the wiring pattern 120 in the substrate base 110, and/or the conductive via 130. The first bonding wire 310 and the second bonding wire 320 may be connected to the respective chip connection pads 122. The first bonding wire 310 and the second bonding wire 320 may be connected to the first chip connection terminal pad 212 of the first semiconductor memory chip 210 and the second chip connection terminal pad 222 of the second semiconductor memory chip 220, respectively.

The chip connection pads 122 respectively connected to the first bonding wire 310 and the second bonding wire 320 may form an electrical path through the wiring pattern 120 on the upper surface of and/or in the substrate base 110, and the conductive via 130. Thereafter, the chip connection pads 122 may be connected to each other at the branch point BPT which is a portion of the wiring pattern 120 or a portion of the conductive via 130 in the substrate base 110. Therefore, an electrical path between the external connection pad 124 and the branch point BPT is the common line CML, and electrical paths from the branch point BPT to the first chip pad 214 and the second chip pad 224 may be the first branch line BRL1 and the second branch line BRL2, respectively.

That is, the branch point BPT of the semiconductor memory package 2 may be a portion of the wiring pattern 120 or a portion of the conductive via 130 in the substrate base 110 while the branch point BPT of the semiconductor memory package 1 shown in FIG. 1 is the chip connection pad 122.

Therefore, the first branch line BRL1 may include the wiring pattern 120 and/or the conductive via 130 in the substrate base 110, the chip connecting pad 122, and the first bonding wire 310. In some example embodiments, the first branch line BRL1 may further include the first chip connection terminal pad 212 and the first rewiring pattern 216 shown in FIG. 1. Therefore, the second branch line BRL2 may include the wiring pattern 120 and/or the conductive via 130 in the substrate base 110, the chip connecting pad 122, and the second bonding wire 310. In some example embodiments, the second branch line BRL2 may further include the second chip connection terminal pad 222 and the second rewiring pattern 226 shown in FIG. 1. The extension length of the second branch line BRL2 may have a value greater than the extension length of the first branch line BRL1.

The open stub 126 may be connected to the external connection pad 124 to which the first external connection terminal 502 is attached, that is, a portion of the common line CML that contacts the package terminal PKT. The open stub 126 may be a portion of the wiring pattern 120 on a lower surface of the substrate base 110. One end of the open stub 126 may be connected to the external connection pad 124 to which the first external connection terminal 502 is attached, and the other end of the open stub 126 may be open without being connected to another electrical path.

A length extending from the one end to the other end of the open stub 126 may be greater than half of the extension length of the second branch line BRL2 having a value greater than that of the extension length of the first branch line BRL1 and less than twice the extension length of the second branch line BRL2. In some example embodiments, the extension length of the open stub 126 may have a value that is substantially the same as that of the extension length of the second branch line BRL2.

Although the second external connection terminal 504 shown in FIG. 1 is omitted in FIG. 5 for convenience of illustration, the semiconductor memory package 2 may include the second external connection terminal 504. Furthermore, the open stub 126 may not be connected to the common line CML connected to the second external connection terminal 504.

Figure 6:
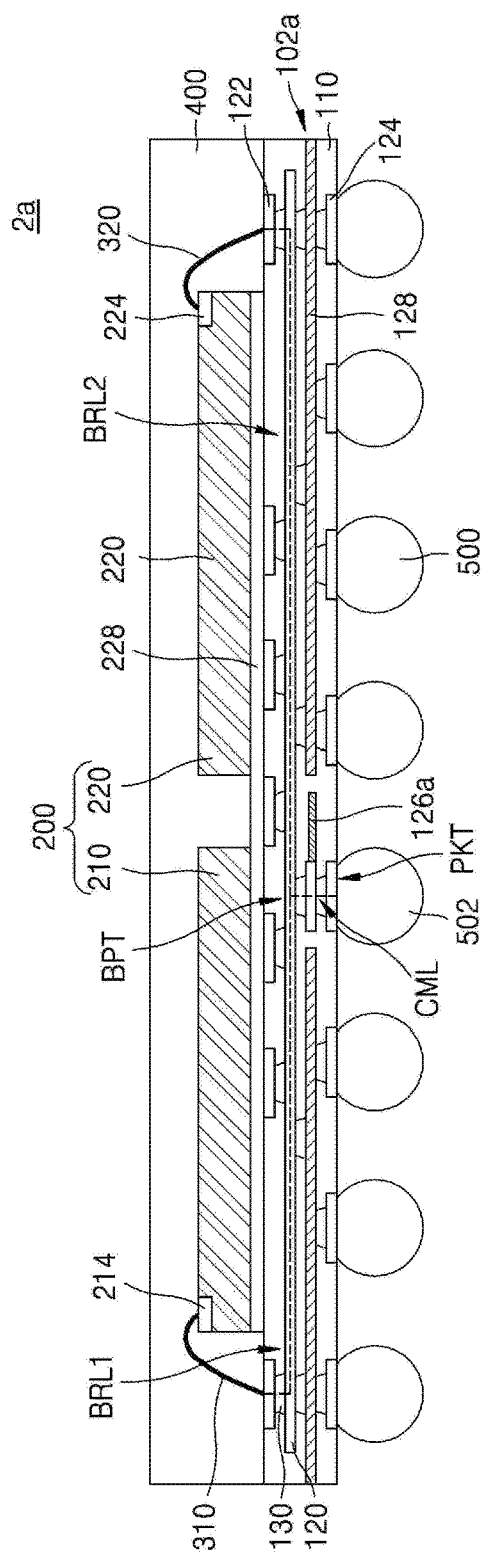
FIG. 6 is a cross-sectional view of a semiconductor memory package according to an example embodiment.

FIG. 6 is a cross-sectional view of a semiconductor memory package 2a according to an example embodiment. In FIG. 6, the same reference numerals as in FIGS. 2 and 5 denote the same elements, and therefore, detailed descriptions thereof will not be given herein.

Referring to FIG. 6, the semiconductor memory package 2a includes a package base substrate 102a and the at least two semiconductor memory chips 200.

The open stub 126a may be connected to a portion closer to the package terminal PKT than the branch point BPT of the common line CML connected to the first external connection terminal 502. For example, the open stub 126a may be between a plurality of layers formed by the substrate base 110. In more detail, the open stub 126a may be a portion of the wiring pattern 120 between the plurality of layers formed by the substrate base 110. One end of the open stub 126a may be connected to a portion closer to the package terminal PKT than the branch point BPT of a central portion of the common line CML connected to the first external connection terminal 502, and the other end of the open stub 126a may be open without being connected to other electrical paths.

That is, when the package base substrate 100 is a multilayer board, the open stub 126a may be arranged on a layer different from a layer where the plurality of chip connection pads 122 and from a layer where the plurality of external connection pads 124 are arranged.

A length extending from the one end to the other end of the open stub 126a may be greater than half of the extension length of the second branch line BRL2 having a value greater than that of the extension length of the first branch line BRL1 and less than twice the extension length of the second branch line BRL2. In some example embodiments, the extension length of the open stub 126a may have a value that is substantially the same as that of the extension length of the second branch line BRL2.

Figure 7:
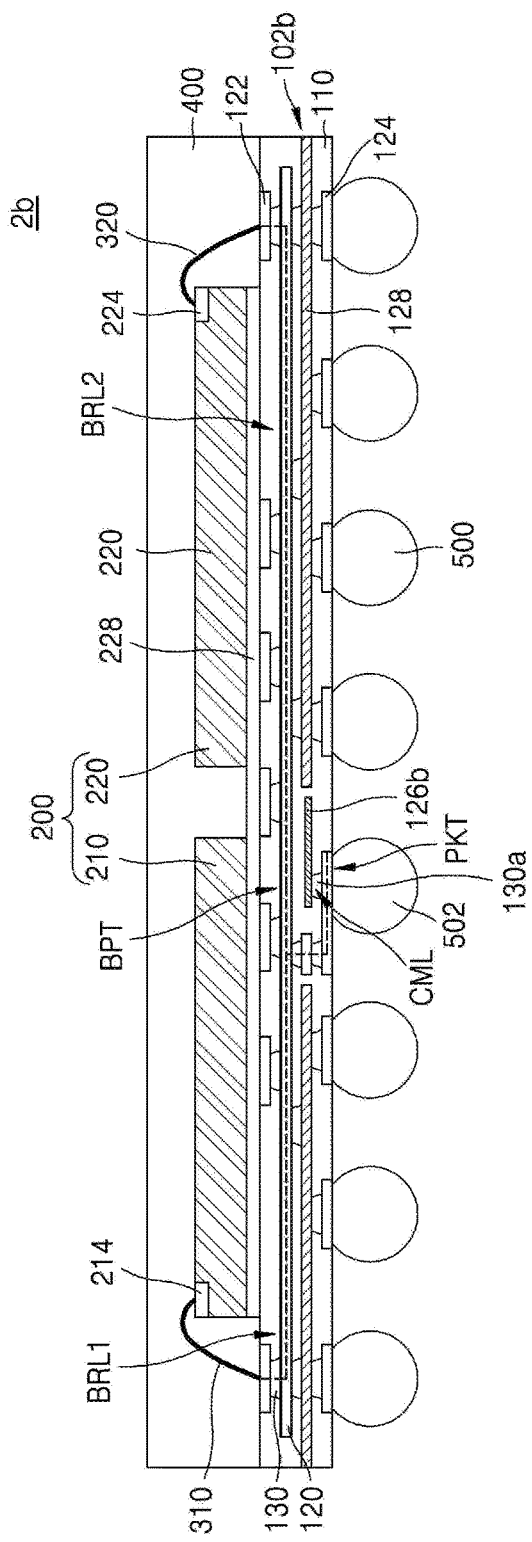
FIG. 7 is a cross-sectional view of a semiconductor memory package according to an example embodiment.

FIG. 7 is a cross-sectional view of a semiconductor memory package 2b according to an example embodiment. In FIG. 7, the same reference numerals as in FIGS. 3 and 5 denote the same elements, and therefore, detailed descriptions thereof will not be given herein.

Referring to FIG. 7, the semiconductor memory package 2b includes a package base substrate 102b and the at least two semiconductor memory chips 200.

The common line CML may include a portion of the wiring pattern 120 extending along the lower surface of the substrate base 110. That is, the common line CML may have a portion extending from the external connection pad 124 along the lower surface of the substrate base 110.

An open stub 126b may be connected to a portion closer to the package terminal PKT than the branch point BPT of the common line CML connected to the first external connection terminal 502. For example, the open stub 126b may be between a plurality of layers formed by the substrate base 110. In more detail, the open stub 126b may be a portion of the wiring pattern 120 between the plurality of layers formed by the substrate base 110. An auxiliary conductive via 130a penetrating a portion of the substrate base 110 may be arranged on the external connection pad 124 to which the first external connection terminal 502 is attached. The open stub 126b may be electrically connected to the external connection pad 124 through the auxiliary conductive via 130a. A height of the auxiliary conductive via 130a may have a relatively small value compared to a value of an extension length of the open stub 126b. Therefore, the open stub 126b may function substantially as if the open stub 126b were connected to the external connection pad 124 to which the first external connection terminal 502 is attached.

A length extending from the one end to the other end of the open stub 126b may be greater than half of the extension length of the second branch line BRL2 having a value greater than that of the extension length of the first branch line BRL1 and less than twice the extension length of the second branch line BRL2. In some example embodiments, the extension length of the open stub 126b may have a value that is substantially the same as that of the extension length of the second branch line BRL2.

Figure 8:
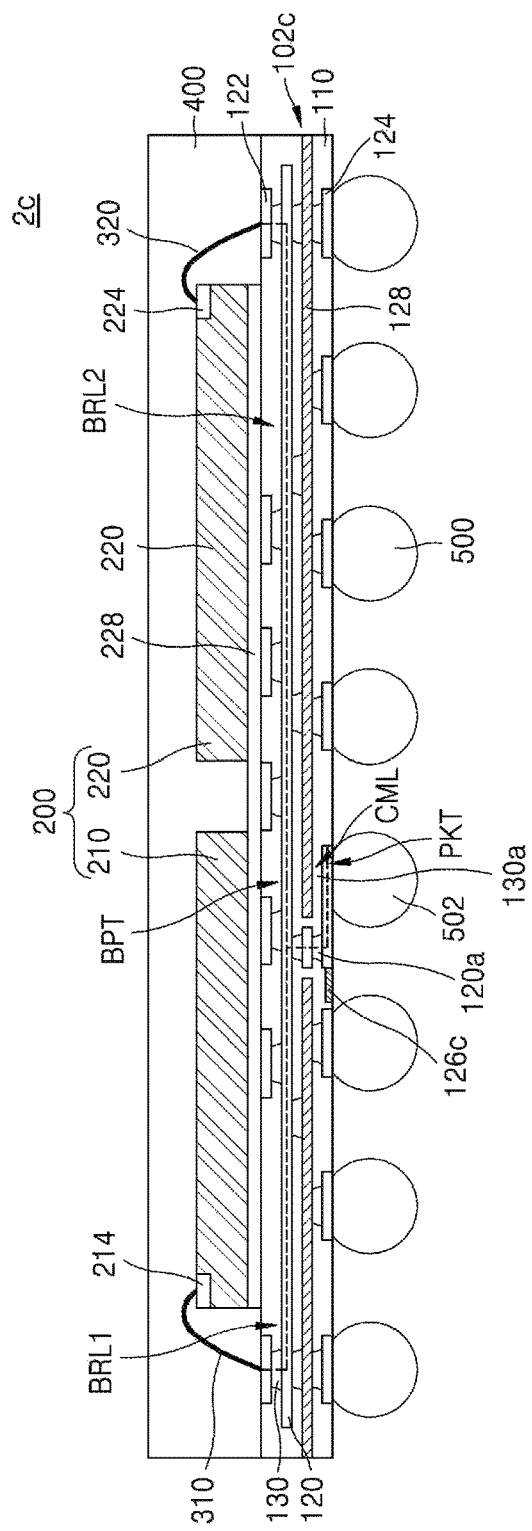
FIG. 8 is a cross-sectional view of a semiconductor memory package according to an example embodiment.

FIG. 8 is a cross-sectional view of a semiconductor memory package 2c according to an example embodiment. In FIG. 8, the same reference numerals as in FIGS. 4 and 5 denote the same elements, and therefore, detailed descriptions thereof will not be given herein.

Referring to FIG. 8, the semiconductor memory package 2c includes a package base substrate 102c and the at least two semiconductor memory chips 200.

The common line CML may include the portion 120a of the wiring pattern 120 extending along the lower surface of the substrate base 110. That is, the common line CML may have the portion 120a extending from the external connection pad 124 along the lower surface of the substrate base 110.

The open stub 126c may be connected to the portion 120a of the wiring pattern 120 extending from the external connection pad 124 along the lower surface of the substrate base 110 and forming a portion of the common line CML. The open stub 126c may extend along the lower surface of the substrate base 110. In more detail, the open stub 126c may be a portion of the wiring pattern 120 on the lower surface of the substrate base 110.

An extension length of the portion 120a of the wiring pattern 120 extending along the lower surface of the substrate base 110 from among the common lines CML may have a smaller value than the extension length of the remaining portion of the common line CML. That is, an extension length of a portion of the common line CML from the package terminal PKT to the position at which the open stub 126c is connected to the common line CML may have a smaller value that an extension length of a portion of the common line CML from the branch point BPT to the position at which the open stub 126c is connected to the common line CML. That is, the open stub 126c may be connected to a portion closer to the package terminal PKT than the branch point BPT of the common line CML connected to the first external connection terminal 502.

A length extending from the one end to the other end of the open stub 126c may be greater than half of the extension length of the second branch line BRL2 having a value greater than that of the extension length of the first branch line BRL1 and less than twice the extension length of the second branch line BRL2. In some embodiments, the extension length of the open stub 126c may have a value that is substantially the same as that of the extension length of the second branch line BRL2.

Figure 9:
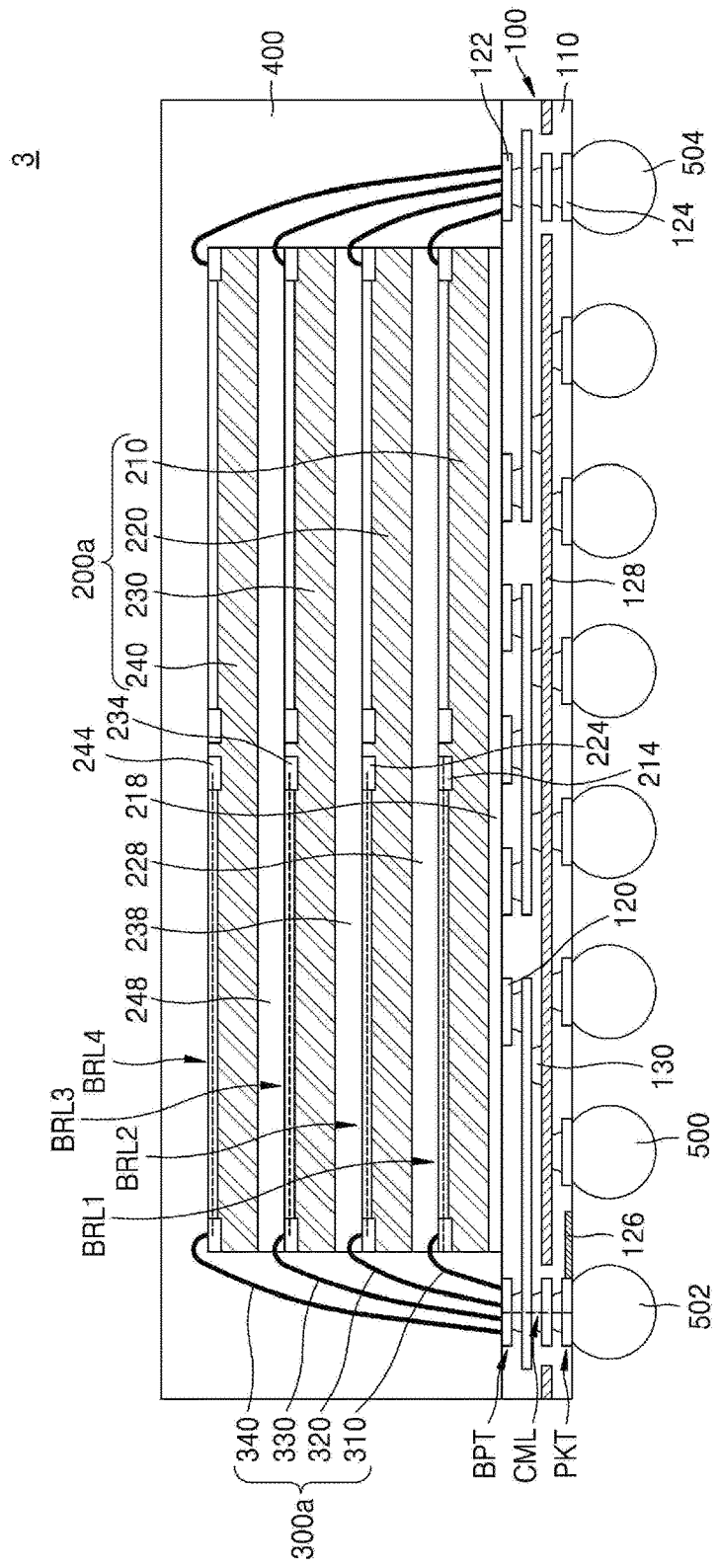
FIG. 9 is a cross-sectional view of a semiconductor memory package according to an example embodiment.

FIG. 9 is a cross-sectional view of a semiconductor memory package 3 according to an example embodiment. In FIG. 9, the same reference numerals as in FIG. 1 denote the same elements, and therefore, detailed descriptions thereof will not be given herein.

Referring to FIG. 9, the semiconductor memory package 3 includes the package base substrate 100 and a plurality of semiconductor memory chips 200a. The plurality of semiconductor memory chips 200a may be mounted on the package base substrate 100. In some example embodiments, the plurality of semiconductor memory chips 200a may be stacked vertically on the package base substrate 100, but are not limited thereto.

The plurality of semiconductor memory chips 200a may include the first semiconductor memory chip 210, the second semiconductor memory chip 220, a third semiconductor memory chip 230, and a fourth semiconductor memory chip 240. In some example embodiments, the first semiconductor memory chip 210 may be mounted on the upper surface of the package base substrate 100 with the first die adhesive film 218 therebetween, the second semiconductor memory chip 220 may be mounted on the first semiconductor memory chip 210 with the second die adhesive film 228 therebetween, the third semiconductor memory chip 230 may be mounted on the second semiconductor memory chip 220 with a third die adhesive film 238 therebetween, and the fourth semiconductor memory chip 240 may be mounted on the third semiconductor memory chip 230 with a fourth die adhesive film 248 therebetween. Since the configuration of each of the plurality of semiconductor memory chips 200a is similar to those of the first and second semiconductor memory chips 210 and 220 shown in FIG. 1, a detailed description thereof will not be given herein.

The plurality of semiconductor memory chips 200a including the first to fourth semiconductor memory chips 210, 220, 230, and 240 may be electrically connected to the chip connection pad 122 through a plurality of bonding wires 300a including a plurality of bonding wires 310, 320, 330, and 340.

Respective electrical paths from the chip connection pad 122 to the chip pads 214, 224, 234, 244 of the first to fourth semiconductor memory chips 210, 220, 230, and 240, respectively, may be referred to as first to fourth branch lines BRL1, BRL2, BRL3, and BRL4, respectively. An extension length of the fourth branch line BRL4 may have a value greater than an extension length of each of the first to third branch lines BRL1, BRL2, and BRL3.

The open stub 126 may be connected to a portion closer to the package terminal PKT than the branch point BPT of the common line CML connected to the first external connection terminal 502. For example, the open stub 126 may be connected to the external connection pad 124 to which the first external connection terminal 502 is attached, that is, a portion of the common line CML that contacts the package terminal PKT. The open stub 126 may be a portion of the wiring pattern 120 on a lower surface of the substrate base 110. One end of the open stub 126 may be connected to the external connection pad 124 to which the first external connection terminal 502 is attached, and the other end of the open stub 126 may be open without being connected to another electrical path.

A length extending from the one end to the other end of the open stub 126 may be greater than half of the extension length of the fourth branch line BRL4 and less than twice the extension length of the fourth branch line BRL4. In some example embodiments, the extension length of the open stub 126 may have a value that is substantially the same as that of the extension length of the fourth branch line BRL4.

The semiconductor memory package 3 according to the example embodiment shown in FIG. 9 includes the open stub 126 connected to the common line CML constituting a memory interface of one channel. Therefore, when any one of the first to third semiconductor memory chips 210, 220, and 230 connected to the first to third branch lines BRL1, BRL2, and BRL3, respectively, having a relatively short extension length receives a signal, a signal reflected by an end of the open stub 126 may compensate for signal distortion due to a signal reflected by an end of the fourth branch line BRL4. Therefore, signal characteristics of a semiconductor memory package that operates at a high speed may be improved.

Figure 10:
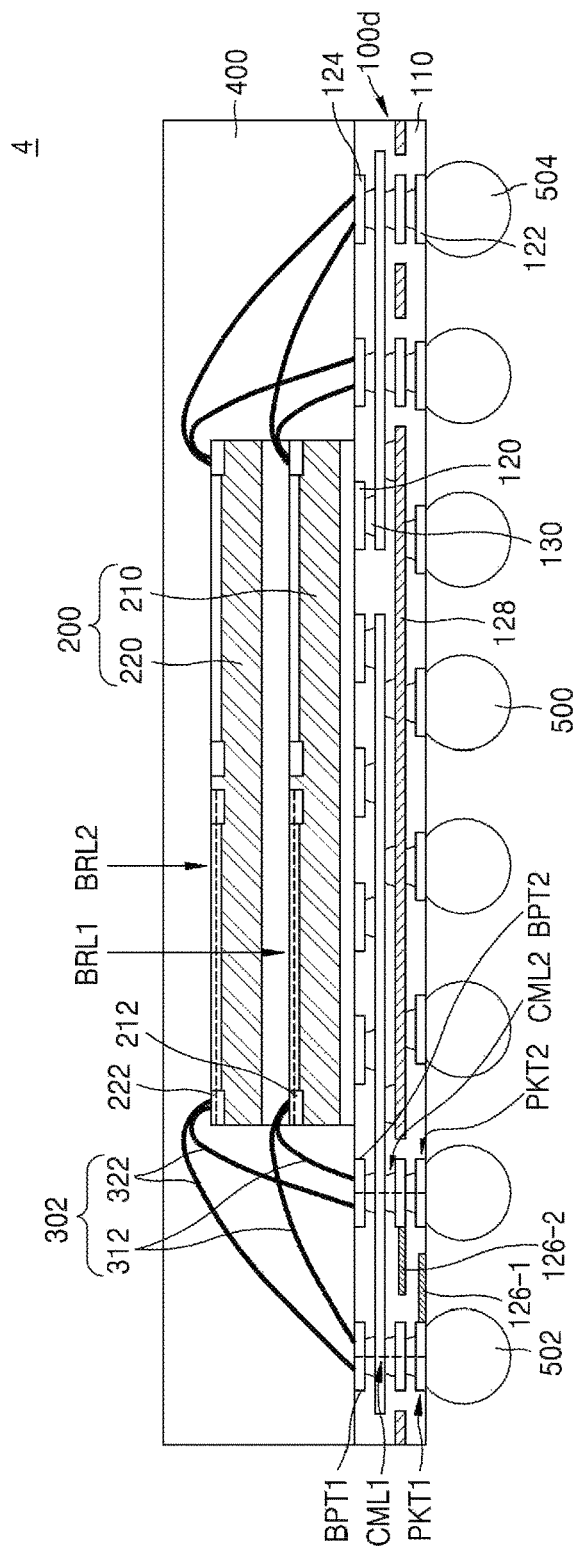
FIG. 10 is a cross-sectional view of a semiconductor memory package according to an example embodiment.

FIG. 10 is a cross-sectional view of a semiconductor memory package 4 according to an example embodiment. In FIG. 10, the same reference numerals as in FIG. 1 denote the same elements, and therefore, detailed descriptions thereof will not be given herein.

Referring to FIG. 10, the semiconductor memory package 4 includes a package base substrate 100d and at least two semiconductor memory chips 200.

The semiconductor memory package 4 includes a first common line CML1 connecting a first package terminal PKT1 to a first branch point BPT1 and a second common line CML2 connecting a second package terminal PKT2 to a second branch point BPT2. At least two branch lines connected to the first branch point BPT1 are similar to the first branch line BRL1 and the second branch line BRL2 shown in FIG. 1, and at least two branch lines connected to the second branch point BPT2 are similar to the first branch line BRL1 and the second branch line BRL2 shown in FIG. 1, respectively. Therefore, a detailed description thereof will not be given herein.

A bonding wire 302 includes a first bonding wire 312 and a second bonding wire 314.

First bonding wires 312 respectively connecting the first branch point BPT1 and the second branch point BPT2 to the first semiconductor memory chip 210 may be connected to the first chip connection terminal pads 212 of the first semiconductor memory chip 210, respectively. Second bonding wires 322 respectively connecting the first branch point BPT1 and the second branch point BPT2 to the second semiconductor memory chip 220 may be connected to the second chip connection terminal pads 222 of the second semiconductor memory chip 220, respectively.

When the package base substrate 100 is a multi-layer substrate, a first open stub 126-1 connected to the first common line CML1 and a second open stub 126-2 connected to the second common line CML2 may be arranged on different layers. For example, the first open stub 126-1 may be a portion of the wiring pattern 120 arranged on the lower surface of the substrate base 110, similar to the open stub 126 shown in FIG. 1, and the second open stub 126-2 may be a portion of the wiring pattern 120 arranged between a plurality of layers included in the substrate base 110, similar to the open stub 126a shown in FIG. 2. The extension length of the first open stub 126-1 may be similar to the extension length of the open stub 126 described with respect to FIG. 1 above, and the extension length of the second open stub 126-2 may be similar to the extension length of the open stub 126a described with respect to FIG. 2 above.

Figure 11:
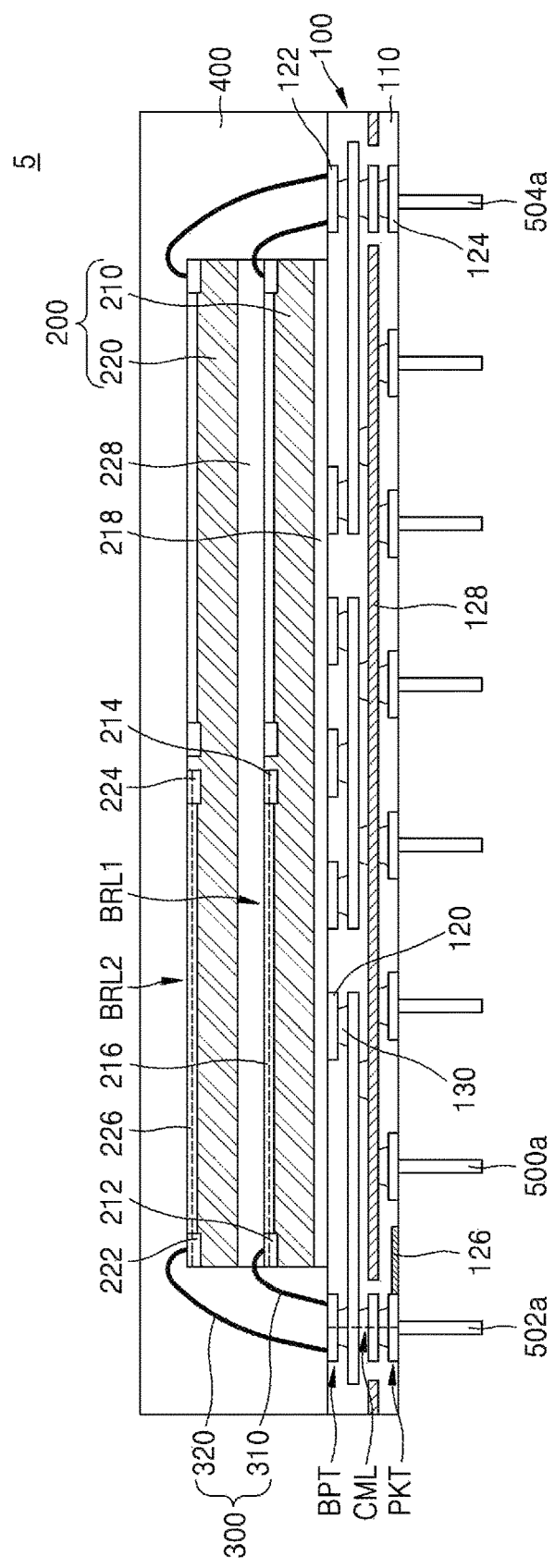
FIG. 11 is a cross-sectional view of a semiconductor memory package according to an example embodiment.

FIG. 11 is a cross-sectional view of a semiconductor memory package 5 according to an example embodiment. In FIG. 11, the same reference numerals as in FIG. 1 denote the same elements, and therefore, detailed descriptions thereof will not be given herein.

Referring to FIG. 11, the semiconductor memory package 5 includes the package base substrate 100 and at least two semiconductor memory chips 200. A plurality of external connection terminals 500a may be respectively attached to the plurality of external connection pads 124 of the package base substrate 100. The plurality of external connection terminals 500a may include a first external connection terminal 502a for transmitting or receiving a relatively high-speed signal, and a second external connection terminal 504a for transmitting or receiving a relatively low-speed signal. The plurality of external connection terminals 500a may be, for example, pins.

Figure 12:
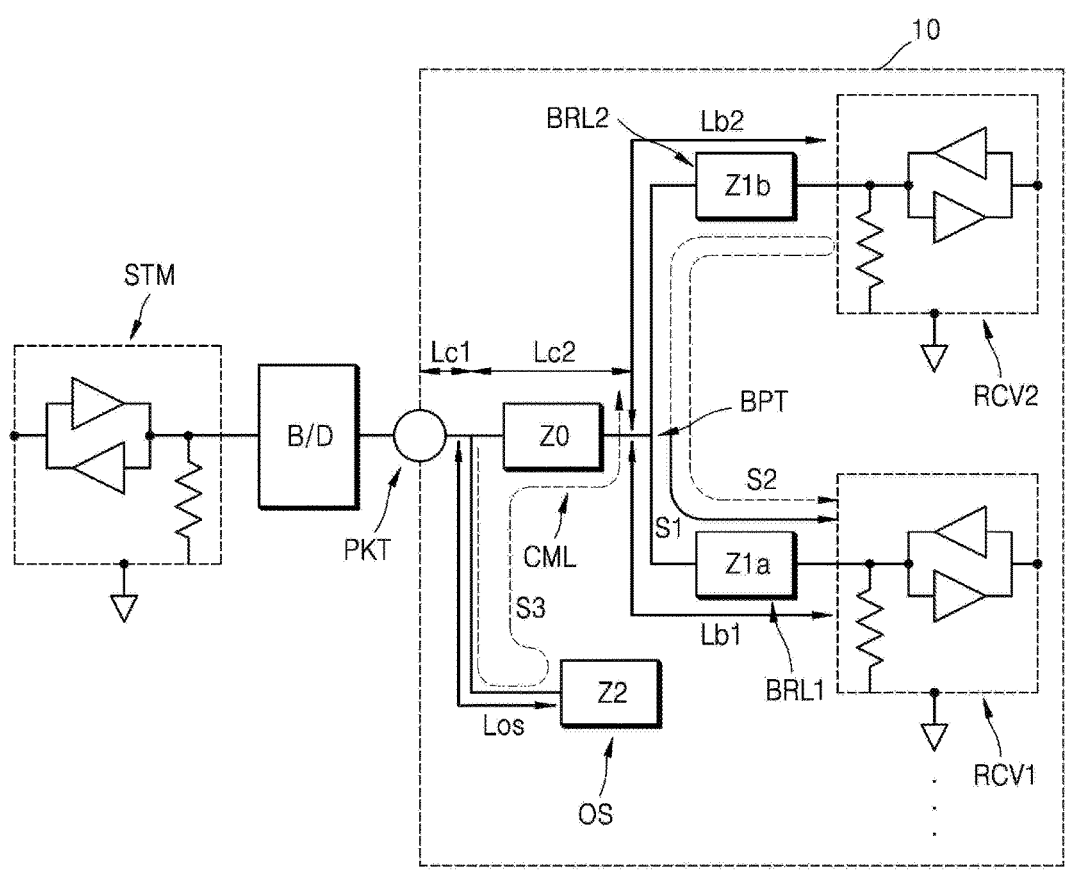
FIG. 12 is a schematic diagram of a channel of a semiconductor memory package according to an example embodiment.

FIG. 12 is a schematic diagram of a channel of a semiconductor memory package 10 according to an example embodiment.

Referring to FIG. 12, the semiconductor memory package 10 may be mounted on a system board B/D. The semiconductor memory package 10 may receive a signal from a transmitter STM of an external system through the system board B/D.

The semiconductor memory package 10 may be, for example, one of the semiconductor memory packages 1, 1a, 1b, 1c, 2, 2a, 2b, 2c, 3, 4, and 5 shown in FIGS. 1 to 11.

The semiconductor memory package 10 may receive a signal from the transmitter STM of an external system through the package terminal PKT. The package terminal PKT may be electrically connected to the branch point BPT by the common line CML. An open stub OS may be connected between the package terminal PKT and the branch point BPT. One end of the open stub OS may be connected between the package terminal PKT and the branch point BPT, and the other end of the open stub OS may be open without being connected to other electrical paths. The open stub OS may be one of the open stubs 126, 126a, 126b, and 126c, the first open stub 126-1, and the second open stub 126-2.

The branch point BPT and a receiver RCV1 of a first semiconductor memory chip may be connected by the first branch line BRL1. The branch point BPT and a receiver RCV2 of a second semiconductor memory chip may be connected by the second branch line BRL2. That is, the first branch line BRL1 and the second branch line BRL2 may be branched from the branch point BPT and connected to the receiver RCV1 of the first semiconductor memory chip and the receiver RCV2 of the second semiconductor memory chip.

The receiver RCV1 of the first semiconductor memory chip may have a configuration inside the first semiconductor memory chip 210 connected to the first chip connection terminal pad 212 shown in FIGS. 1 to 11, and the receiver RCV2 of the second semiconductor memory chip may have a configuration inside the second semiconductor memory chip 220 connected to the second chip connection terminal pad 222 shown in FIGS. 1 to 11. Otherwise, the receiver RCV1 of the first semiconductor memory chip and the receiver RCV2 of the second semiconductor memory chip may have a configuration inside one of the first to fourth semiconductor memory chips 210, 220, 230, and 240.

In some example embodiments, a first extended length Lc1, which is a distance between a portion where the open stub OS is connected to the common line CML and the package terminal PKT, may be less than the second extension length Lc2, which is a distance between a portion where the open stub OS is connected to the common line CML and the branch point BPT. In some example embodiments, a first extension length Lc1 may be zero.

A first branch extension length Lb1, which is the extension length of the first branch line BRL1, may be less than a second branch extension length Lb2, which is the extension length of the second branch line BRL2. An open stub extension length Los extending from one end of the open stub OS to the other end of the open stub OS may be greater than half of the second branch extension length Lb2 and may be less than twice the second branch extension length Lb2. In some example embodiments, the open stub extension length Los may have a value that is substantially the same as that of the second branch extension length Lb2.

A sum of the first extension length Lc1 and the second extension length Lc2 may be a physical length of the common line CML or an impedance Z0 of the common line CML. Similarly, the first branch extension length Lb1 and the second branch extension length Lb2 may be physical lengths of the first branch line BRL1 and the second branch line BRL2, or an impedance Z1a of the first branch line BRL1 and an impedance Z1b of the second branch line BRL2, respectively. Furthermore, an open stub extension length Los may be a physical length of the open stub OS or an impedance Z2 of the open stub OS.

In the related art in which a package without the open stub is provided, when receiving a signal S1 transmitted from the transmitter STM of an external system from the receiver RCV1 of the first semiconductor memory chip through the first branch line BRL1, a signal S2 reflected by the end of the second branch line BRL2 may cause signal distortion.

However, in the semiconductor memory package 1 according to the example embodiments, a signal reflected by the end of the open stub OS may compensate for the signal distortion due to the signal S2 reflected by the end of the second branch line BRL2. Therefore, signal characteristics of the semiconductor memory package 10 performing high-speed operation may be improved.

Although FIG. 12 shows a case where the receiver RCV1 of the first semiconductor memory chip and the receiver RCV2 of the second semiconductor memory chip receive signals from the transmitter STM of the external system, the signal characteristics of the semiconductor memory package 10 may be improved by the open stud OS even when a receiver of the external system receives a signal from a transmitter of the first semiconductor memory chip and a transmitter of the second semiconductor memory chip. In some example embodiments, the receiver RCV1 of the first semiconductor memory chip and the receiver RCV2 of the second semiconductor memory chip may function as the transmitter of the first semiconductor memory chip and the transmitter of the second semiconductor memory chip, respectively, and the transmitter STM of the external system may function as the receiver of the external system. Thus, bidirectional communication is possible.

FIGS. 13A-13E are graphs of waveforms reaching a receiver in a channel of a semiconductor memory package according to an example embodiment.

Figure 13A:
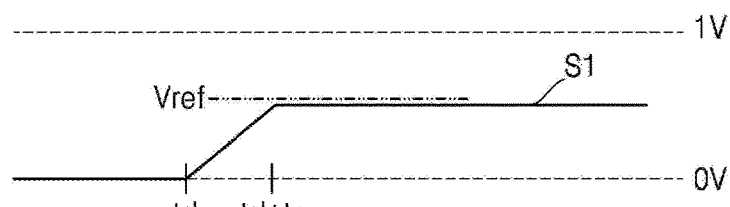
FIGS. 13A-13E are graphs of waveforms reaching a receiver in a channel of a semiconductor memory package according to an example embodiment.
Figure 13B:
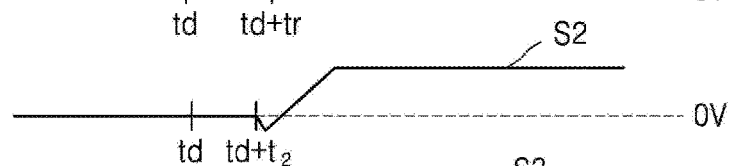
Figure 13C:
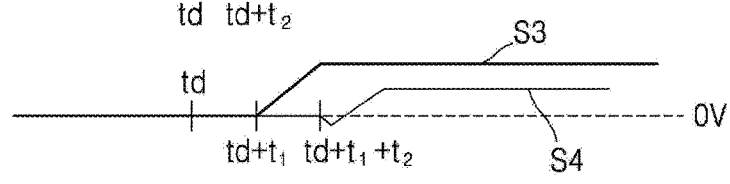

Referring to FIGS. 12 and 13A-13E, FIG. 13A shows a first signal S1 transmitted from the transmitter STM of the external system and received by the receiver RCV1 of the first semiconductor memory chip, and FIG. 13B shows a second signal S2 reflected by the end of the second branch line BRL2 and received by the receiver RCV1 of the first semiconductor memory chip. FIG. 13C shows a third signal S3 reflected by the end of the open stub OS and received by the receiving unit RCV1 of the first semiconductor memory chip, and a fourth signal S4 reflected by the end of the open stub OS and then reflected back by the end of the second branch line BRL2 and received by the receiver RCV1 of the first semiconductor memory chip.

"td" denotes a signal transmission time from the transmitter STM of the external system to the receiver RCV1 of the first semiconductor memory chip, and "tr" denotes a rise time of a signal. "T1" denotes a first time which is a time until a signal transmitted from the common line CML to the open stub OS reaches the common line CML again after being reflected by the end of the open stub OS, and "t2" denotes a second time which is a time until a signal transmitted from the branch point BPT to the second branch line BRL2 reaches the branch point BPT again after being reflected by the end of the second branch line BRL2.

When, as in the related art, there is no open stub OS, the receiver RCV1 of the first semiconductor memory chip receives the first signal S1 together with the second signal S2. Therefore, signal distortion may occur due to signal bending of the second signal S2.

Figure 13D:
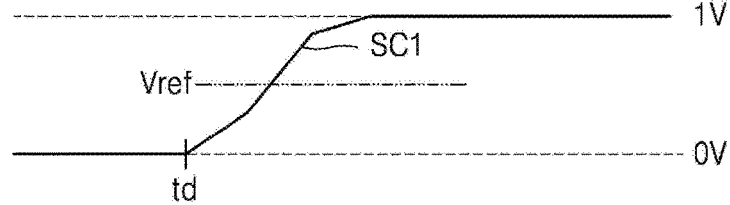
Figure 13E:
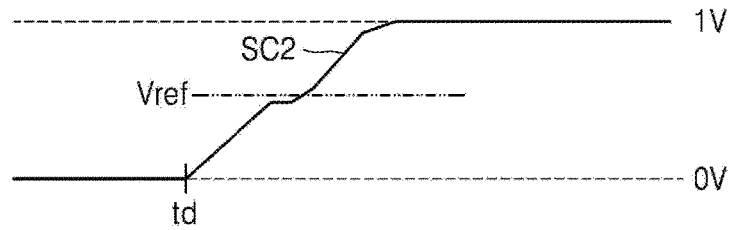

FIGS. 13D and 13E show compensation signals SC1 and SC2 in which first to fourth signals S1, S2, S3, and S4 are superimposed. FIG. 13D shows the compensation signal SC1 when the rise time tr of the signal is greater than the second time t2, and FIG. 13E shows the compensation signal SC1 when the rise time tr of the signal is less than the second time t2.

Referring to FIGS. 13D and 13E, in the compensation signals SC1 and SC2, the signal distortion that may occur due to the signal bending of the second signal S2 is compensated for by the third signal S3 and the fourth signal S4, so that signal bending may be reduced or may not appear.

FIGS. 14 to 18 are layouts of a wiring pattern of a package base substrate of a semiconductor memory package according to an example embodiment.

Figure 14:
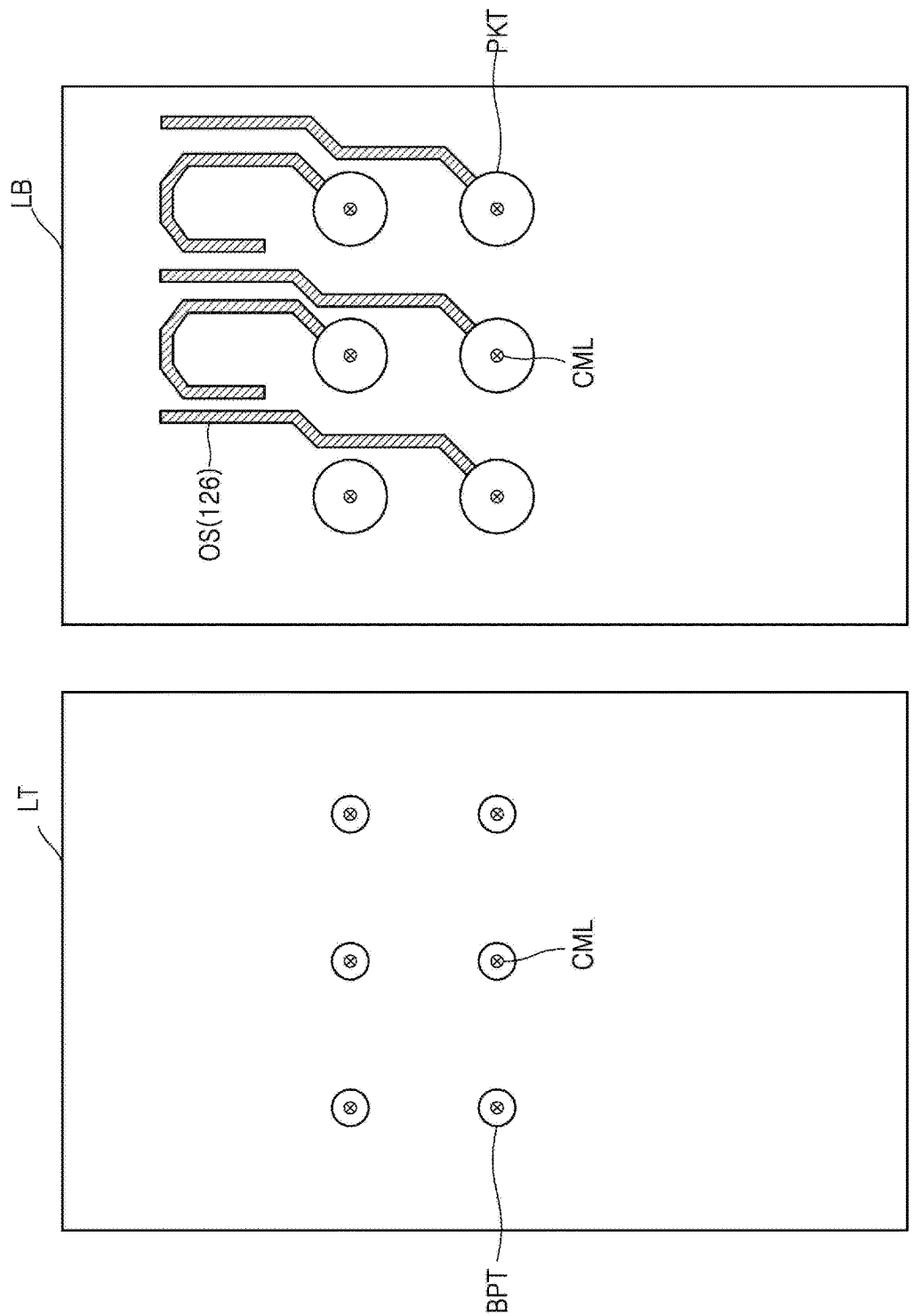

FIGS. 1, 5, and 14 show a bottom layer LB on the lower surface of the substrate base 110 of the package base substrate 100 and a top layer LT on the upper surface of the substrate base 110.

When a space for arranging the open stub OS is secured in a portion of the bottom layer LB adjacent to the package terminal PKT, the open stub OS may be arranged on the bottom layer LB where the package terminal PKT is arranged. The open stub OS may extend from the package terminal PKT along the bottom layer LB. The open stub OS may be the open stub 126 shown in FIG. 1 or FIG. 5. The branch point BPT may be arranged on the top layer LT. The package terminal PKT may be connected to the branch point BPT by the common line CML.

Figure 15:
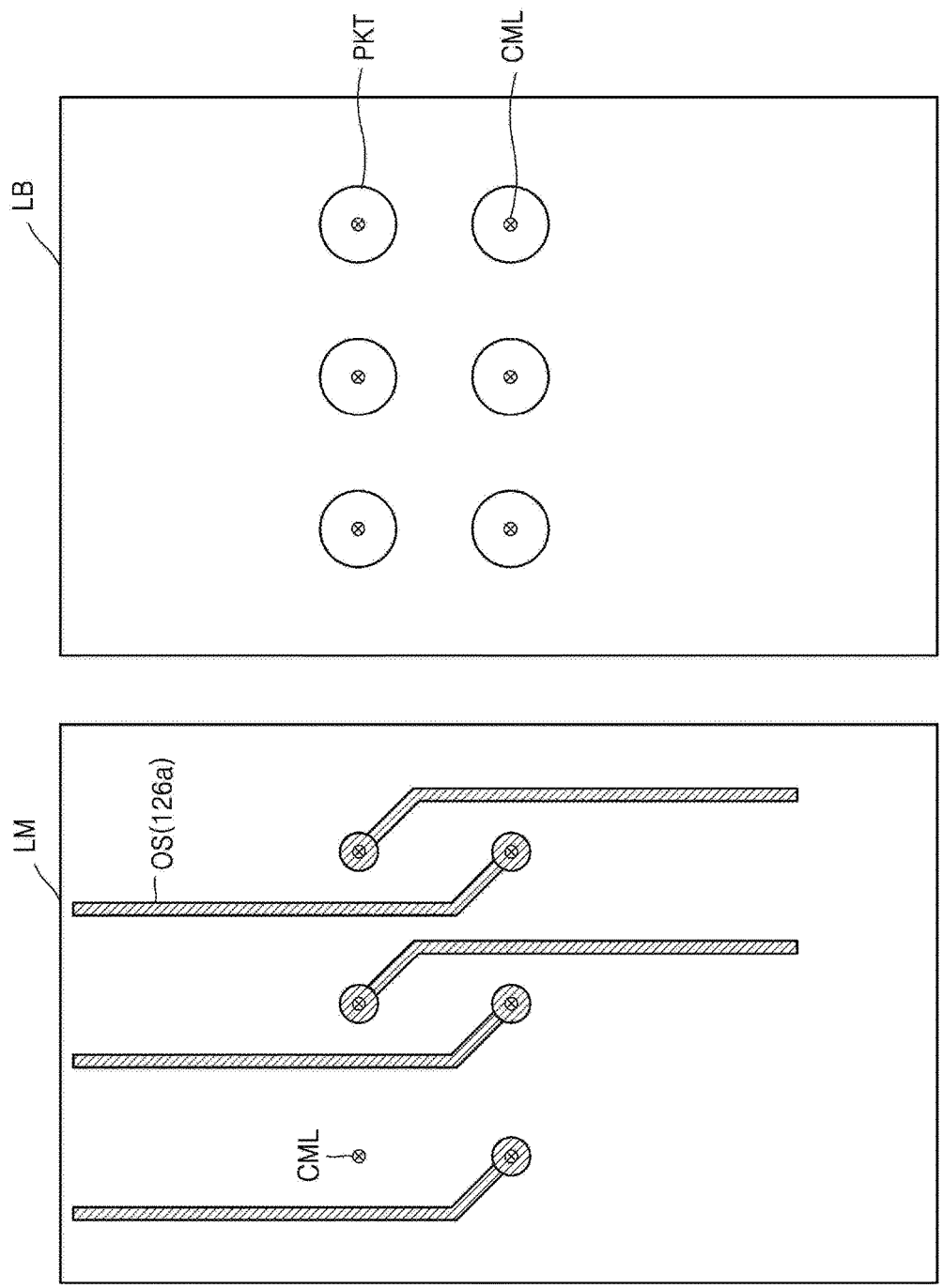

FIGS. 2, 6, and 15 show the bottom layer LB on the lower surface of the substrate base 110 of the package base substrate 100a and a middle layer LM between each of a plurality of layers included in the substrate base 110.

When a space for arranging the open stub OS is not secured in the portion of the bottom layer LB adjacent to the package terminal PKT due to other wiring patterns, the open stub OS may be arranged on the middle layer LM instead of the bottom layer LB in which the package terminal PKT is arranged.

The open stub OS may extend from the common line CML along the middle layer LM. The open stub OS may be an open stub 126a shown in FIG. 2 or FIG. 6.

FIGS. 3, 7, and 16 show the bottom layer LB on the lower surface of the substrate base 110 of the package base substrate 100b and the middle layer LM between each of the plurality of layers included in the substrate base 110.

When a space for arranging the open stub OS is not secured in the portion of the bottom layer LB adjacent to the package terminal PKT because the portion 120a of the wiring pattern 120, which is a portion of the common line CML, is arranged on the portion of the bottom layer LB adjacent to the package terminal PKT, the open stub OS may be arranged on the middle layer LM instead of the bottom layer LB in which the package terminal PKT is arranged. The open stub OS may be electrically connected to the package terminal PKT through the auxiliary conductive via 130a arranged on the package terminal PKT and penetrates through a portion of the substrate base 110, and may extend along the middle layer LM. The open stub OS may be the open stub 126b shown in FIG. 3 or FIG. 7.

Figure 17:
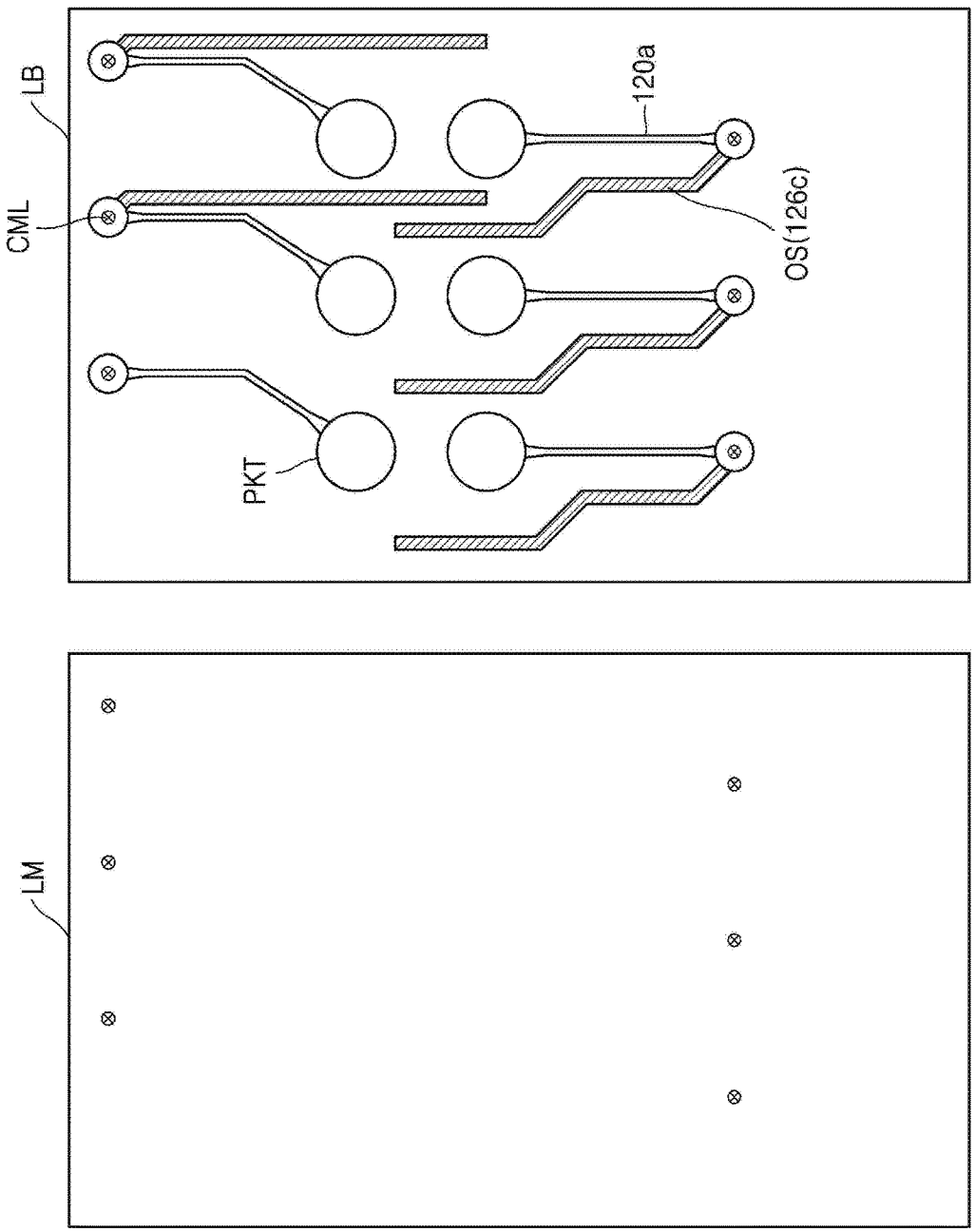

FIGS. 4, 8, and 17 show the bottom layer LB on the lower surface of the substrate base 110 of the package base substrate 100c and the middle layer LM between each of the plurality of layers included in the substrate base 110.

When a space for arranging the open stub OS is not secured in the portion of the bottom layer LB adjacent to the package terminal PKT because the portion 120a of the wiring pattern 120, which is a portion of the common line CML, is arranged on the portion of the bottom layer LB adjacent to the package terminal PKT, the open stub OS may be arranged on the bottom layer LB so as to extend from the portion 120a of the wiring pattern 120 extending from the package terminal PKT. FIG. 17 shows that the open stub OS is connected to the other end of the portion 120a of the wiring pattern 120 opposite one end of the portion 120a of the wiring pattern 120, the one end being connected to the package terminal PKT, but the inventive concept is not limited thereto. The open stub OS may be connected to an intermediate portion of the wiring pattern 120. The open stub OS may be the open stub 126c shown in FIG. 4 or FIG. 8.

Figure 18:
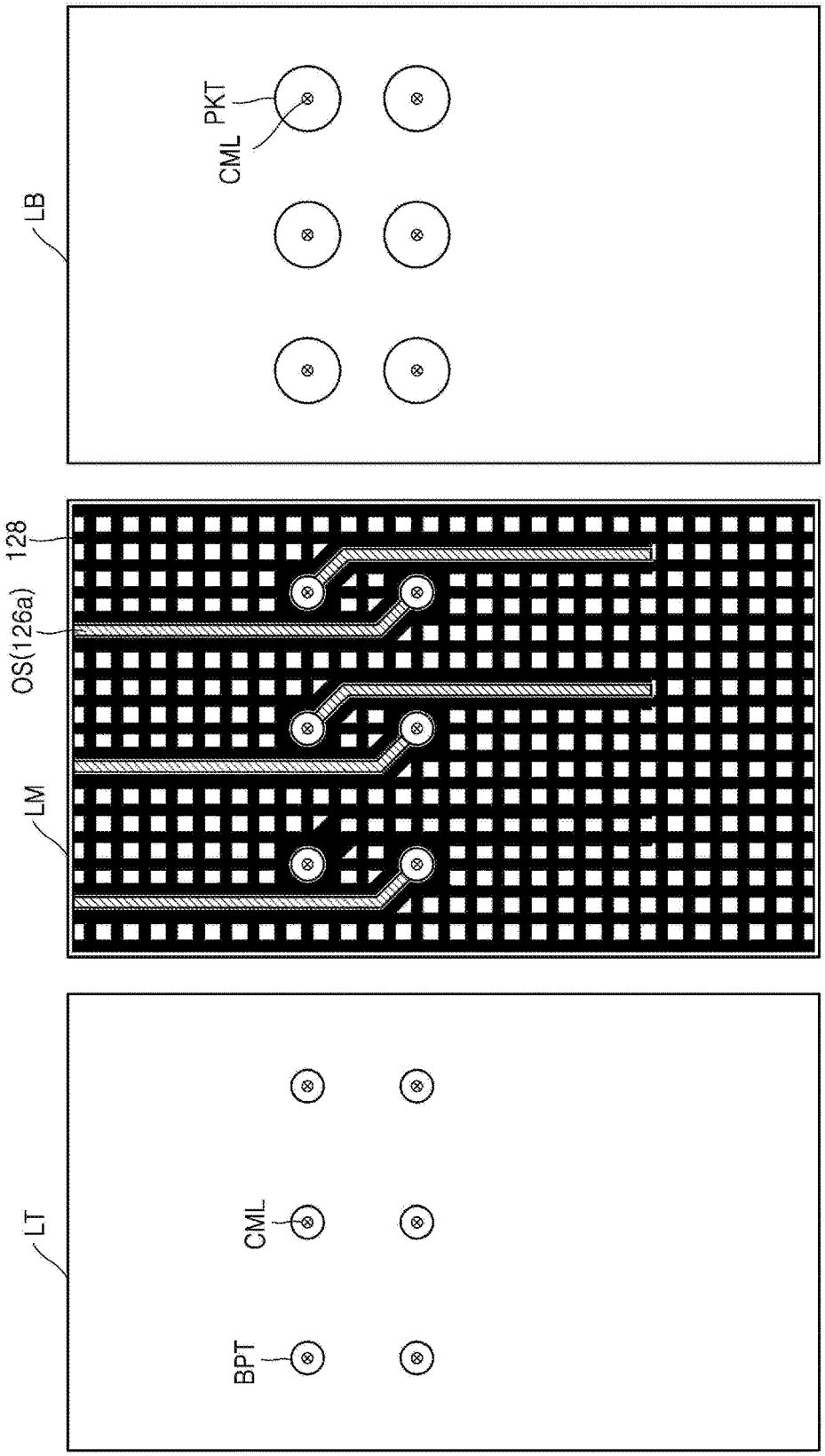

FIGS. 2, 6, and 18 show the bottom layer LB on the lower surface of the substrate base 110 of the package base substrate 100a and a middle layer LM between each of a plurality of layers included in the substrate base 110.

When a space for arranging the open stub OS is not secured in the portion of the bottom layer LB adjacent to the package terminal PKT due to other wiring patterns, the open stub OS may be arranged on the middle layer LM instead of the bottom layer LB in which the package terminal PKT is arranged.

The middle layer LM may be a layer on which the ground plane layer 128 is arranged. The open stub OS may extend from the common line CML and away from the ground plane layer 128 along the space between the ground plane layer 128 and the middle layer LM. The open stub OS may be the open stub 126a shown in FIG. 2 or 6. The ground plane layer 128 may occupy most of the area of the middle layer LM where the ground plane layer 128 is arranged. Therefore, even when a portion of the ground plane layer 128 is removed to form a slit that is a space in which the open stub OS is to be arranged, the function of the ground plane layer 128 may not be affected.

FIGS. 19A-19D are signal eye diagrams for comparing semiconductor memory packages according to an example embodiment with a comparative example.

Figure 19A:
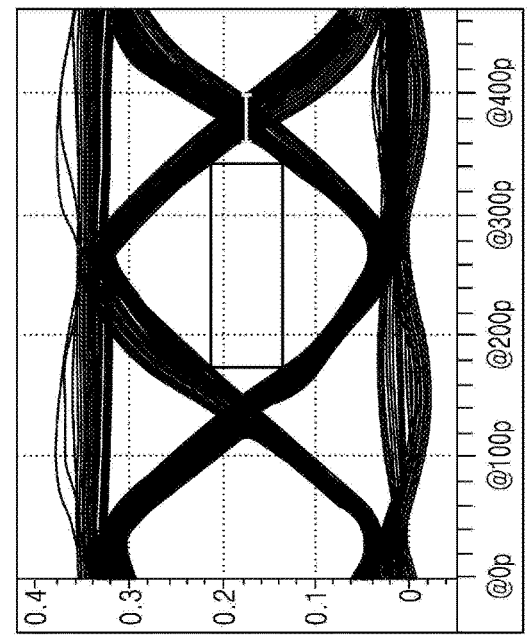
FIGS. 19A-19D are signal eye diagrams for comparing semiconductor memory packages according to an example embodiment with a comparative example.
Figure 19B:
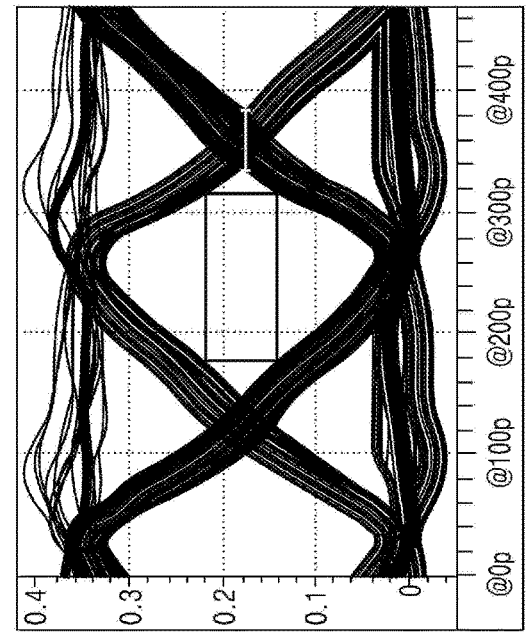
Figure 19C:
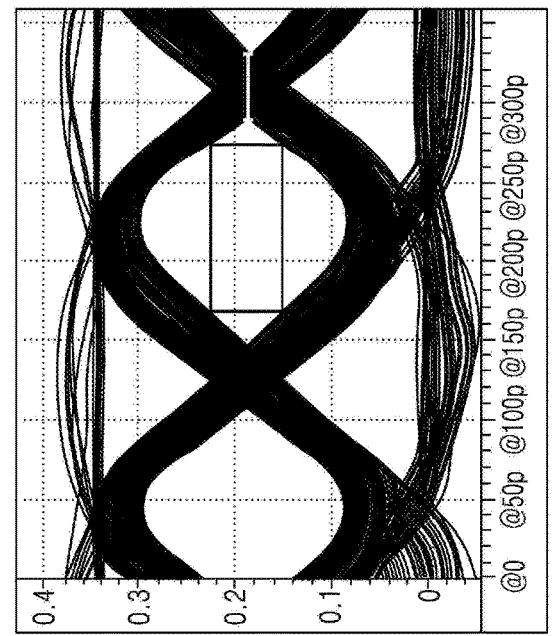
Figure 19D:
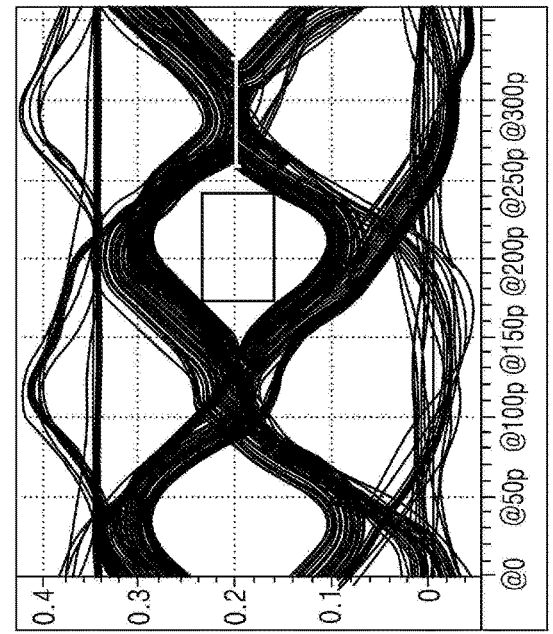

Referring to FIGS. 19A-19D, FIGS. 19A-19B are signal eye diagrams of a semiconductor memory package according to a comparative example and a semiconductor memory package according to an example embodiment, respectively, when a transmission rate is 4266 Mbps, and FIGS. 19C-19D are signal eye diagrams of a semiconductor memory package according to a comparative example and a semiconductor memory package according to an example embodiment, respectively, when a transmission rate is 5600 Mbps.

Unlike the semiconductor memory package according to the example embodiments, the semiconductor memory package according to the comparative example does not have open stubs 126, 126a, 126b, and 126c (of FIGS. 1 to 11).

Compared to the signal eye diagrams of the semiconductor memory package according to the comparative example shown in FIGS. 19A and 19C, the signal eye diagrams of the semiconductor memory package according to the example embodiments shown in FIGS. 19B and 19D show a larger eye opening of an eye pattern. Therefore, it can be seen that the quality of a signal received by a semiconductor memory package according to an example embodiment is excellent.

Furthermore, it can be seen that the degree of decrease in an eye opening size in a case of FIG. 19D when a transmission rate is 5600 Mbps compared with a case of FIG. 19B when a transmission rate is 4266 Mbps in a semiconductor memory package according to an example embodiment is less than the degree of decrease in an eye opening size in a case of FIG. 19C when a transmission rate is 5600 Mbps compared with a case of FIG. 19A when a transmission rate is 4266 Mbps in a semiconductor memory package according to a comparative example. Therefore, it can be seen that a semiconductor memory package according to an example embodiment has excellent high-speed operation characteristics.

A semiconductor memory package according to the example embodiments includes a plurality of semiconductor memory chips connected to each other through a plurality of branch lines constituting multiple branches connected to a common line in a single channel memory interface, and further includes an open stub connected to the common line.

Therefore, the semiconductor memory package according to the example embodiments may improve signal characteristics and may operate at a high speed because a signal reflected by the open stub may compensate for signal distortion caused by a signal reflected by a branch line other than a branch line receiving a signal.

While the inventive concept has been particularly shown and described with reference to example embodiments thereof, it will be understood that various changes in form and details may be made therein without departing from the spirit and scope of the following claims.

What is claimed is:

1. A semiconductor memory package comprising:
   a package base substrate comprising a substrate base, and a plurality of chip connection pads and a plurality of external connection pads respectively arranged on upper and lower surfaces of the substrate base; and
   at least two semiconductor memory chips mounted on the package base substrate and each having a plurality of chip pads electrically connected to the plurality of chip connection pads,
   wherein a first electrical path extends from one of the plurality of external connection pads to a first chip pad of one of the at least two semiconductor memory chips and a second electrical path extends from the one of the plurality of external connection pads to a second chip pad of another of the at least two semiconductor memory chips,
   the first electrical path and the second electrical path comprises a common line extending from a branch point of the first electrical path and the second electrical path, to the one of the plurality of external connection pads,
   a first branch line of the first electrical path extends from the branch point to the first chip pad and a second branch line of the second electrical path extends from the branch point to the second chip pad, and the package base substrate comprises an open stub extending from the common line, the open stub having one end connected to the common line and another other end which is open without being connected to another electrical path and having a stub extension length greater than half of a branch extension length of a longer of the first branch line and the second branch line and less than twice the branch extension length.

2. The semiconductor memory package of claim 1, wherein the one end of the open stub is connected to a portion of the common line closer to the one of the plurality of external connection pads than the branch point.

3. The semiconductor memory package of claim 1, wherein the one end of the open stub is connected to the one of the plurality of external connection pads.

4. The semiconductor memory package of claim 1, wherein the open stub extends along a lower surface of the substrate base.

5. The semiconductor memory package of claim 1, wherein the substrate base comprises a plurality of layers, and
the open stub is provided on a middle layer of the plurality of layers.

6. The semiconductor memory package of claim 5, wherein the plurality of layers comprises a ground plane layer.

7. The semiconductor memory package of claim 6, wherein the open stub is provided on the ground plane layer.

8. The semiconductor memory package of claim 6, further comprising an auxiliary conductive via arranged on the one of the plurality of external connection pads and connected to the open stub through a portion of the substrate base.

9. The semiconductor memory package of claim 1, wherein the branch point is one of the plurality of chip connection pads.

10. The semiconductor memory package of claim 9, wherein each of the first branch line and the second branch line comprises a bonding wire.

11. The semiconductor memory package of claim 1, wherein the branch point is a portion of a wiring pattern or a conductive via in the substrate base.

12. The semiconductor memory package of claim 11, wherein each of the first branch line and the second branch line comprises the portion of the wiring pattern or the conductive via in the substrate base connected to one of the plurality of chip connection pads, and a bonding wire connecting the one of the plurality of chip connection pads to one of the plurality of chip pads.

13. The semiconductor memory package of claim 1, wherein the one of the plurality of external connection pads is for data input/output or a clock signal.

14. A semiconductor memory package comprising:
a package base substrate comprising a substrate base comprising a plurality of layers, a plurality of chip connection pads arranged on an upper surface of the substrate base and a plurality of external connection pads arranged on a lower surface of the substrate base and electrically connected to the plurality of chip connection pads, a ground plane layer formed between the plurality of layers included in the substrate base, and an open stub electrically connected to one of the plurality of external connection pads and extending between the plurality of layers and away from the ground plane layer;

a first semiconductor memory chip attached on the package base substrate and a second semiconductor memory chip stacked on the first semiconductor memory chip, the first semiconductor memory chip having a first chip connection terminal pad, a first chip pad, and a first rewiring pattern connecting the first chip connection terminal pad to the first chip pad, and the second semiconductor memory chip having a second chip connection terminal pad, a second chip pad, and a second rewiring pattern connecting the second chip connection terminal pad to the second chip pad; and a first bonding wire connecting the first chip connection terminal pad to one or more of the plurality of chip connection pads, and a second bonding wire connecting the second chip connection terminal pad to one or more of the plurality of chip connection pads.

15. The semiconductor memory package of claim 14, wherein the ground plane layer is located at a level closer to the lower surface than to the upper surface of the substrate base, and
a stub extension length of the open stub is greater than half of a sum of a bonding wire extension length of the second bonding wire and a rewiring extension length of the second rewiring pattern of the second semiconductor memory chip, and less than twice the sum.

16. A semiconductor memory package comprising:
a base substrate comprising a chip connection pad arranged on an upper surface thereof, and an external connection pad arranged on a lower surface thereof, a common line electrically connecting the chip connection pad to the external connection pad through the base substrate;

a first semiconductor memory chip provided on the upper surface of the base substrate and comprising a first chip pad electrically connected to an internal circuit of the first semiconductor chip, the first chip pad being electrically connected to the external connection pad by a first electrical path comprising the common line and a first branch line;

a second semiconductor memory chip provided on the upper surface of the package base and comprising a second chip pad electrically connected to an internal circuit of the second semiconductor chip, the second chip pad being electrically connected to the external connection pad by a second electrical path comprising the common line and a second branch line; and an open stub having one end connected to the common line and the other end being open without being connected to another electrical path.

17. The semiconductor memory package of claim 16, wherein the open stub has a stub extension length greater than half of a branch extension length of a longer of the first branch line and the second branch line, and less than twice the branch extension length.

18. The semiconductor memory package of claim 16, wherein the common line includes the external connection pad, and the one end of the open stub is connected to the external connection pad.

19. The semiconductor memory package of claim 16, wherein the base substrate comprises a plurality of layers, and the open stub is provided on a middle layer of the plurality of layers.

20. The semiconductor memory package of claim 16, wherein the second semiconductor memory chip is provided on the first semiconductor memory chip.

* * * * *